(12) United States Patent
Aoyama

(10) Patent No.: US 8,253,497 B2
(45) Date of Patent: Aug. 28, 2012

(54) ATOMIC OSCILLATOR

(75) Inventor: Taku Aoyama, Setagaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/037,667

(22) Filed: Mar. 1, 2011

(65) Prior Publication Data

US 2011/0215878 A1    Sep. 8, 2011

(30) Foreign Application Priority Data

Mar. 2, 2010   (JP) ................... 2010-045081

(51) Int. Cl.
*H03L 7/26* (2006.01)
(52) U.S. Cl. ........................... 331/3; 331/94.1
(58) Field of Classification Search ............ 331/3, 94.1
See application file for complete search history.

(56) References Cited

U.S. PATENT DOCUMENTS

| 5,189,368 | A * | 2/1993 | Chase ............... 324/304 |
| 6,265,945 | B1 | 7/2001 | Delaney et al. |

FOREIGN PATENT DOCUMENTS

| JP | 2010-147367 | 7/2010 |
| JP | 2010-147967 | 7/2010 |

* cited by examiner

*Primary Examiner* — Arnold Kinkhead
(74) *Attorney, Agent, or Firm* — Harness, Dickey & Pierce, P.L.C.

(57) ABSTRACT

An atomic oscillator, attention is paid to the fact that the degree of change of the energy difference between the two ground levels of the alkali metal atom with respect to the change of the magnetic field intensity is specific to each of the magnetic quantum numbers, a resonant light pair to cause a transition between the two ground levels corresponding to each of the plural magnetic quantum numbers is sequentially generated, plural pieces of profile information capable of specifying the energy difference between the two ground levels corresponding to each of the magnetic quantum numbers are sequentially acquired based on the detection signal, the change amount of the magnetic field intensity is specified based on the acquired plural pieces of profile information, and the control is performed so that the intensity of the magnetic field becomes constant.

7 Claims, 14 Drawing Sheets

ATOMIC OSCILLATOR

BACKGROUND

1. Technical Field

The present invention relates to an atomic oscillator.

2. Related Art

An atomic oscillator based on an EIT (Electromagnetically Induced Transparency) system (also called a CPT (Coherent Population Trapping) system) is an oscillator using a phenomenon in which when two kinds of resonant lights having coherency and having specific wavelengths (frequencies) different from each other are simultaneously irradiated to an alkali metal atom, absorption of the resonant lights is stopped.

As shown in FIG. 14, it is known that the interaction mechanism between the alkali metal atom and the two kinds of resonant lights can be explained in a Λ-type three-level model. The alkali metal atom has two ground levels, and when resonant light 1 having a frequency corresponding to an energy difference between the ground level 1 and the excited level or resonant light 2 having a frequency corresponding to an energy difference between the ground level 2 and the excited level is individually irradiated to the alkali metal atom, light absorption occurs as is well known. However, when the resonant light 1 and the resonant light 2 are simultaneously irradiated to the alkali metal atom, a superimposed state of the two ground levels, that is, a quantum interference state occurs, the excitation to the excited level is stopped, and the transparency phenomenon (EIT phenomenon) occurs in which the resonant light 1 and the resonant light 2 pass through the alkali metal atom. For example, in a cesium atom, a ground state of a D2 line (wavelength is 852.1 nm) is split into two states having levels of F=3 and F=4 by an hyper fine structure, and the frequency corresponding to the energy difference between the ground level 1 of F=3 and the ground level 2 of F=4 is 9.192631770 GHz. Accordingly, when two kinds of laser lights having wavelengths of about 852.1 nm and a frequency difference of 9.192631770 GHz are simultaneously irradiated to the cesium atom, the two kinds of laser lights become a resonant light pair and the EIT phenomenon occurs.

When the two kinds of lights different in frequency are irradiated to the alkali metal atom, the light absorption behavior is abruptly changed according to whether or not the two kinds of lights become the resonant light pair and the alkali metal atom produces the EIT phenomenon. A signal representing the abruptly changing light absorption behavior is called an EIT signal, and when the frequency difference between the resonant light pair accurately coincides with the frequency (for example, 9.192631770 GHz for the cesium atom) corresponding to the energy difference $\Delta E_{12}$ between the two ground levels, the level of the EIT signal indicates the peak value. Then, an oscillator with high accuracy can be realized by detecting the peak value of the EIT signal and by performing frequency control so that the two kinds of lights irradiated to the alkali metal atom become the resonant light pair, that is, the frequency difference between the two kinds of lights accurately coincides with the frequency corresponding to $\Delta E_{12}$.

It is known that when a magnetic field is applied to the alkali metal atom, each of the two ground levels is split (call Zeeman splitting) into plural levels according to the magnetic quantum number. That is, since the energy difference $\Delta E_{12}$ between the two ground levels changes according to each magnetic quantum number, when the frequency difference between the resonant light pair is changed, plural EIT signals appear. At this time, when the intensity of the magnetic field is very low, the plural EIT signals are superimposed on each other and one EIT signal having a wide line width is obtained. Thus, it becomes difficult to accurately detect the peak value, and the frequency accuracy is deteriorated. However, it is difficult to completely eliminate the influence of magnetic field due to disturbance. Then, attention is paid to the fact that in a low magnetic field, even if the intensity of the magnetic field is changed, the energy difference $\Delta E_{12}$ between the two ground levels for the magnetic quantum number 0 can be regarded as being almost constant, an atomic oscillator is proposed in which the frequency accuracy is improved by applying a low magnetic field to an alkali metal atom to such a degree that plural EIT signals are completely separated and by detecting the peak value of the EIT signal for the magnetic quantum number 0.

U.S. Pat. No. 6,265,945 is an example of related art.

However, it is very difficult to cancel the influence of the disturbance and to stably control the weak magnetic field. Further, even in the weak magnetic field, since the energy difference $\Delta E_{12}$ between the two ground levels changes subtly, it is difficult to further improve the frequency accuracy in the related art system.

SUMMARY

An advantage of some aspects of the invention is to provide an atomic oscillator in which frequency accuracy can be improved.

According to an aspect of the invention, an atomic oscillator using an electromagnetically induced transparency phenomenon produced by irradiating a resonant light pair to an alkali metal atom includes a gaseous alkali metal atom, a light source that generates plural lights having coherency and including a first light and a second light different in frequency and irradiates the lights to the alkali metal atom, a magnetic field generation part that generates a magnetic field to cause Zeeman splitting in each of a first ground level and a second ground level of the alkali metal atom, a light detection part that receives a light passing through the alkali metal atom and generates a detection signal corresponding to an intensity of the received light, a frequency control part that performs frequency control of at least one of the first light and the second light based on the detection signal and causes the first light and the second light to become the resonant light pair which produces the electromagnetically induced transparency phenomenon in the alkali metal atom, and a magnetic field control part that controls, based on the detection signal, an intensity of the magnetic field generated by the magnetic field generation part. The frequency control part switches a frequency of at least one of the first light and the second light at a specified switching timing so that the first light and the second light sequentially become the resonant light pair which causes a transition between the first ground level and the second ground level corresponding to each of plural magnetic quantum numbers among the plural first ground levels and the plural second ground levels generated by the Zeeman splitting. The magnetic field control part sequentially acquires profile information capable of specifying an energy difference between the first ground level and the second ground level when the first light and the second light become the resonant light pair to cause the transition between the first ground level and the second ground level corresponding to each of the magnetic quantum numbers, and controls the intensity of the magnetic field generated by the magnetic field generation part based on a plurality of pieces of the acquired profile information so that the intensity of the magnetic field applied to the alkali metal atom becomes constant.

The alkali metal atom is an element (Na, K, Rb, Cs, ...) which belongs to the first group in the first column of the periodic table.

In general, when the intensity of the magnetic field applied to the alkali metal atom is constant, the energy difference between two ground levels corresponding to an arbitrary magnetic quantum number of the alkali metal atom is constant. Accordingly, when the intensity of the magnetic field is not changed, an atomic oscillator with high frequency accuracy can be realized by performing feedback control, so that even if the frequency of the atomic oscillator is changed due to temperature change or the like and the light detection intensity is temporarily reduced, the EIT phenomenon to cause a transition between the two ground levels corresponding to any one of the magnetic quantum numbers is continued. In order to keep the intensity of the magnetic field constant, it is conceivable that the change of the detection intensity of light passing through the alkali metal atom is detected and the change amount of the magnetic field is specified. However, even when the change of the light detection intensity is simply detected, it is impossible to determine whether the light detection intensity is changed since the intensity of the magnetic field is changed, or whether the light detection intensity is changed since the oscillation frequency is shifted by the influence of temperature change or the like.

Then, in the aspect of the invention, attention is paid to the fact that the degree of change of the energy difference between the two ground levels of the alkali metal atom with respect to the change of the magnetic field intensity is specific to each of the magnetic quantum numbers, a resonant light pair to cause a transition between the two ground levels corresponding to each of the plural magnetic quantum numbers is sequentially generated, plural pieces of profile information capable of specifying the energy difference between the two ground levels corresponding to each of the magnetic quantum numbers are sequentially acquired based on the detection signal, the change amount of the magnetic field intensity is specified based on the acquired plural pieces of profile information, and the control is performed so that the intensity of the magnetic field becomes constant. According to the atomic oscillator having the structure as described above, the change amount of the intensity of the magnetic field applied to the alkali metal atom is certainly grasped, and the change of the magnetic field intensity can be suppressed within a very small range. Therefore, the frequency accuracy can be improved as compared with related art.

Besides, according to the atomic oscillator, it is not necessary to apply a weak magnetic field to the alkali metal atom unlike the related art, and the change amount of the magnetic field due to the disturbance can be relatively reduced. Therefore, stable control of the magnetic field is easy, and the frequency stability can be raised.

The atomic oscillator may be configured such that the light source is subjected to frequency modulation by a modulation signal of a specified frequency, and generates the plural lights including the first light and the second light. The frequency control part includes a voltage control oscillator to generate an oscillation signal oscillating at a frequency corresponding to an oscillation control voltage based on the detection signal, a frequency conversion part to perform frequency conversion of the oscillation signal at a frequency conversion rate to generate the modulation signal, and a frequency switching control part that switches the frequency conversion rate at the switching timing and causes the first light and the second light to sequentially become the resonant light pair to cause the transition between the first ground level and the second ground level corresponding to each of the magnetic quantum numbers.

According to this configuration, the frequency (modulation frequency) of the modulation signal generated by the frequency conversion part is switched, and the light source is modulated, so that it becomes easy to sequentially generate the EIT phenomenon to cause the transition between the two ground levels corresponding to each of the plural magnetic quantum numbers.

The atomic oscillator may be configured such that the magnetic field control part sequentially acquires, as the profile information, a value of the oscillation control voltage when the first light and the second light become the resonant light pair to cause the transition between the first ground level and the second ground level corresponding to each of the magnetic quantum numbers.

The atomic oscillator may be configured such that the frequency control part changes the frequency of at least one of the first light and the second light and causes the first light and the second light to become the resonant light pair to cause the transition between the first ground level and the second ground level corresponding to each of a first magnetic quantum number, a second magnetic quantum number, and a third magnetic quantum number. When the first light and the second light become the resonant light pair to cause the transition between the first ground level and the second ground level corresponding to each of the first magnetic quantum number, the second magnetic quantum number, and the third magnetic quantum number, the magnetic field control part acquires first profile information, second profile information and third profile information. Based on the first profile information, the second profile information and the third profile information, the magnetic field control part calculates a ratio of a difference between an energy difference between the first ground level and the second ground level corresponding to the first magnetic quantum number and an energy difference between the first ground level and the second ground level corresponding to the second magnetic quantum number to a difference between an energy difference between the first ground level and the second ground level corresponding to the second magnetic quantum number and an energy difference between the first ground level and the second ground level corresponding to the third magnetic quantum number, and controls the intensity of the magnetic field generated by the magnetic field generation part based on a calculation result.

With respect to the change of the magnetic field intensity, since the degree of the change of the energy difference between the two ground levels corresponding to each of the three magnetic quantum numbers m1, m2 and m3 of the alkali metal atom is different from each other, the intensity of the magnetic field can be uniquely determined by the value of the ratio of the difference between the energy difference between the two ground levels corresponding to the magnetic quantum number m1 and the energy difference between the two ground levels corresponding to the magnetic quantum number m2 to the difference between the energy difference between the two ground levels corresponding to the magnetic quantum number m2 and the energy difference between the two ground levels corresponding to the magnetic quantum number m3. Accordingly, according to the atomic oscillator, the value of the ratio is calculated, and the feedback control can be performed so that the intensity of the magnetic field becomes constant.

The atomic oscillator may be configured such that the frequency control part changes the frequency of at least one of the first light and the second light and causes the first light and the second light to become the resonant light pair to cause the transition between the first ground level and the second ground level corresponding to each of a first magnetic quantum number and a second magnetic quantum number. The magnetic field control part acquires first profile information and second profile information when the first light and the second light become the resonant light pair to cause the transition between the first ground level and the second ground level corresponding to each of the first magnetic quantum number and the second magnetic quantum number. Based on the first profile information and the second profile information, the magnetic field control part calculates a difference between an energy difference between the first ground level and the second ground level corresponding to the first magnetic quantum number and an energy difference between the first ground level and the second ground level corresponding to the second magnetic quantum number, and controls the intensity of the magnetic field generated by the magnetic field generation part based on a calculation result.

Since the degree of the change of the energy difference between the two ground levels corresponding to each of the two magnetic quantum numbers m1, m2 of the alkali metal atom is different from each other, the intensity of the magnetic field can be uniquely specified by the value of the difference between the energy difference between the two ground levels corresponding to the magnetic quantum number m1 and the energy difference between the two ground levels corresponding to the magnetic quantum number m2. Accordingly, according to the atomic oscillator, the value of the difference is calculated, and the feedback control can be performed so that the intensity of the magnetic field becomes constant.

The atomic oscillator may be configured such that the frequency control part changes a period of the switching timing according to a degree of intensity change of the magnetic field generated by the magnetic field generation part.

The atomic oscillator may be configured to include a storage part to store the profile information or magnetic field intensity information capable of specifying the intensity of the magnetic field based on the profile information. The frequency control part determines the degree of the intensity change of the magnetic field generated by the magnetic field generation part based on the profile information or the magnetic field intensity information stored in the storage part, and changes the period of the switching timing.

According to this configuration, for example, when the magnetic field is frequently changed or the change amount of the magnetic field is large, the period of the switching timing is shortened to shorten the adjustment period of the magnetic field, and when the magnetic field hardly changes, the period of the switching timing is lengthened to lengthen the adjustment period of the magnetic filed. As stated above, more delicate magnetic field control becomes possible, and the frequency stability can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described in detail with reference to the drawings. Incidentally, embodiments described below do not unduly limit the contents of the invention recited in the claims. Besides, all structures described below are not necessarily indispensable components of the invention.

Figure 1:
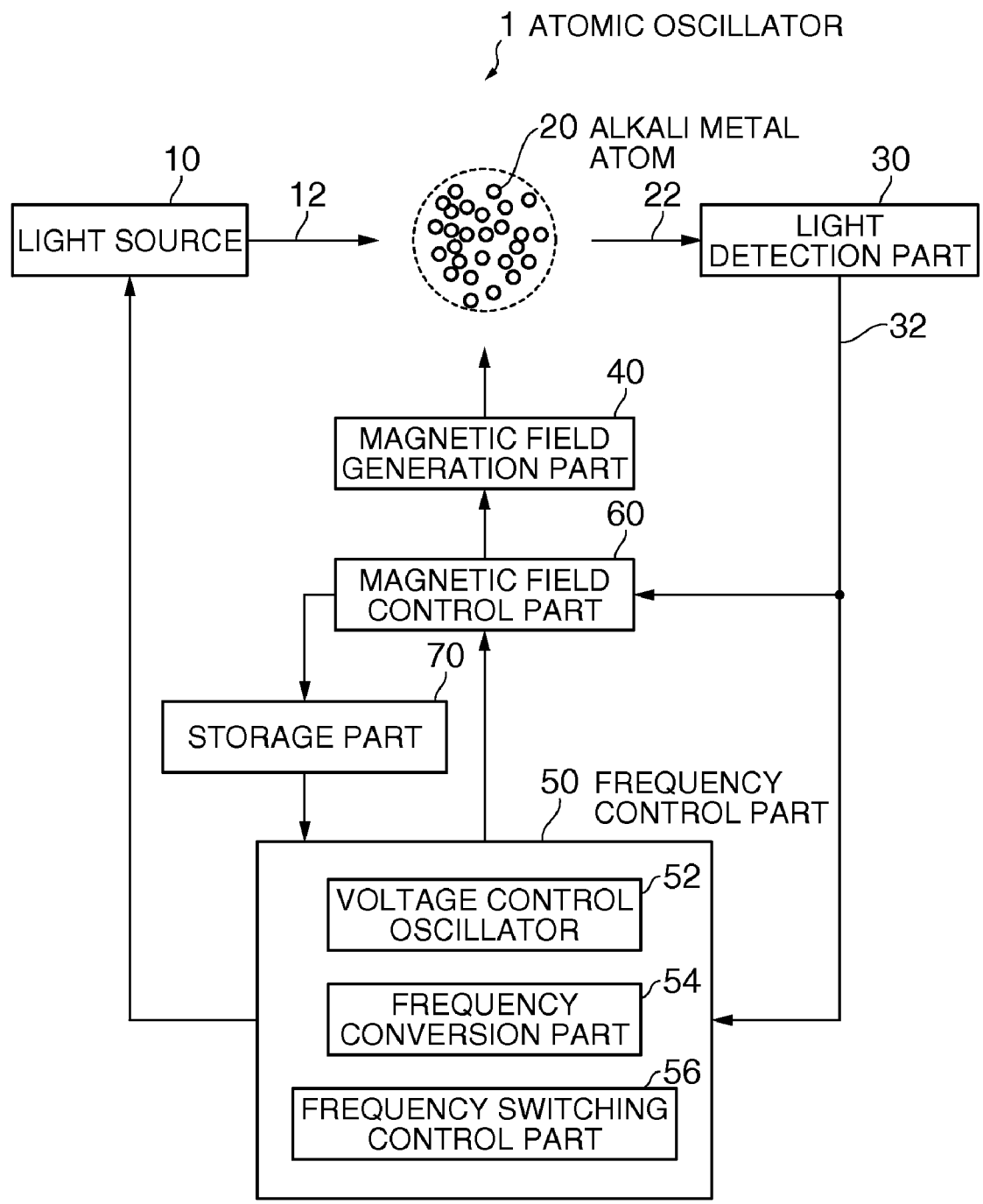
FIG. 1 is a function block diagram of an atomic oscillator of an embodiment.

FIG. 1 is a function block diagram of an atomic oscillator of an embodiment.

The atomic oscillator 1 of this embodiment includes a light source 10, an alkali metal atom 20, a light detection part 30, a magnetic field generation part 40, a frequency control part 50 and a magnetic field control part 60.

The light source 10 generates plural lights 12 having coherency and including a first light and a second light different in frequency, and irradiates the lights to the gaseous alkali metal atom 20 (sodium (Na) atom, rubidium (Rb) atom, cesium (Cs) atom, etc.). For example, a laser light is a light having coherency.

The light detection part 30 receives a light (transmitted light) 22 passing through the alkali metal atom 20, and generates a detection signal 32 corresponding to the intensity of the received light.

Here, for example, a gas cell in which the gaseous alkali metal atom 20 is sealed in an airtight container may be disposed between the light source 10 and the light detection part 30. Besides, the light source 10, the gaseous alkali metal atom 20 and the light detection part 30 are sealed in an airtight container, and the light source 10 and the light detection part 30 may be disposed to be opposite to each other.

The magnetic generation part 40 generates a magnetic field to cause Zeeman splitting in the first ground level and the second ground level of the alkali metal atom 20. The magnetic field generation part 40 can be realized by, for example, a coil.

The magnetic field control part 60 controls the intensity of the magnetic field generated by the magnetic field generation part 40 based on the detection signal 32 of the light detection part 30. Specifically, the magnetic field control part 60 sequentially acquires profile information capable of specifying an energy difference between the first ground level and the second ground level when the first light and the second light generated by the light source 10 become a resonant light pair to cause a transition between the first ground level and the second ground level corresponding to each of specified magnetic quantum numbers. Based on the acquired plural pieces of profile information, the magnetic field control part controls the intensity of the magnetic field generated by the magnetic field generation part 40 so that the intensity of the magnetic field applied to the alkali metal atom 20 becomes constant. For example, when the magnetic field generation part 40 is a coil, the magnetic field control part 60 controls the amount of current flowing through the coil based on the acquired plural pieces of profile information, and can control to keep the intensity of the magnetic field constant.

Based on the detection signal 32 of the light detection part 30, the frequency control part 50 performs frequency control of at least one of the first light and the second light, so that the first light and the second light generated by the light source 10 become the resonant light pair to produce the EIT phenomenon in the alkali metal atom 20. Specifically, the frequency control part 50 switches the frequency of at least one of the first light and the second light at a specified switching timing so that the first light and the second light generated by the light source 10 become the resonant light pair to cause a transition between the first ground level and the second ground level corresponding to each of plural specified magnetic quantum numbers among plural first ground levels and plural second ground levels of the alkali metal atom generated by Zeeman splitting. Incidentally, the first light and the second light become the resonant light pair not only when the frequency difference accurately coincides with the frequency corresponding to the energy difference between the two ground levels of the alkali metal atom, but also when the frequency difference includes a minute error within a range in which the alkali metal atom 20 causes the EIT phenomenon.

The frequency control part 50 includes, for example, a voltage control oscillator 52, a frequency conversion part 54 and a frequency switching control part 56. Here, the voltage control oscillator 52 generates an oscillation signal oscillating at a frequency corresponding to an oscillation control voltage based on the detection signal 32 of the light detection part 30. The frequency conversion part 54 performs frequency conversion of the oscillation signal of the voltage control oscillator 52 at a specified frequency conversion rate and generates a modulation signal of a specified frequency. The frequency switching control part 56 switches the frequency conversion rate of the frequency conversion part 54 at a specified switching timing, so that the first light and the second light generated by the light source 10 sequentially become the resonant light pair to cause the transition between the first ground level and the second ground level corresponding to each of the specified magnetic quantum numbers. The light source 10 is frequency modulated by the modulation signal generated by the frequency conversion part 54 and generates the plural lights 12 including the first light and the second light. In this case, the magnetic field control part 60 may sequentially acquire, as profile information, the value of the oscillation control voltage of the voltage control oscillator 52 when the first light and the second light generated by the light source 10 become the resonant light pair to cause the transition between the first ground level and the second ground level corresponding to each of the specified magnetic quantum numbers.

The frequency control part 50 may change the period of the switching timing (timing when the frequency of at least one of the first light and the second light is switched) according to the degree of intensity change of the magnetic field generated by the magnetic field generation part 40. Specifically, the atomic oscillator 1 includes a storage part 70 to store plural pieces of profile information acquired by the magnetic field control part 60 or magnetic field intensity information capable of specifying the intensity of magnetic field based on the profile information. The frequency control part 50 determines the degree of intensity change of the magnetic field generated by the magnetic field generation part 40 based on the profile information or the magnetic field intensity information stored in the storage part 70, and may change the period of the switching timing based on the determination result.

Hereinafter, a more specific structure of the atomic oscillator of this embodiment will be described.

(1) First Embodiment

Figure 2:
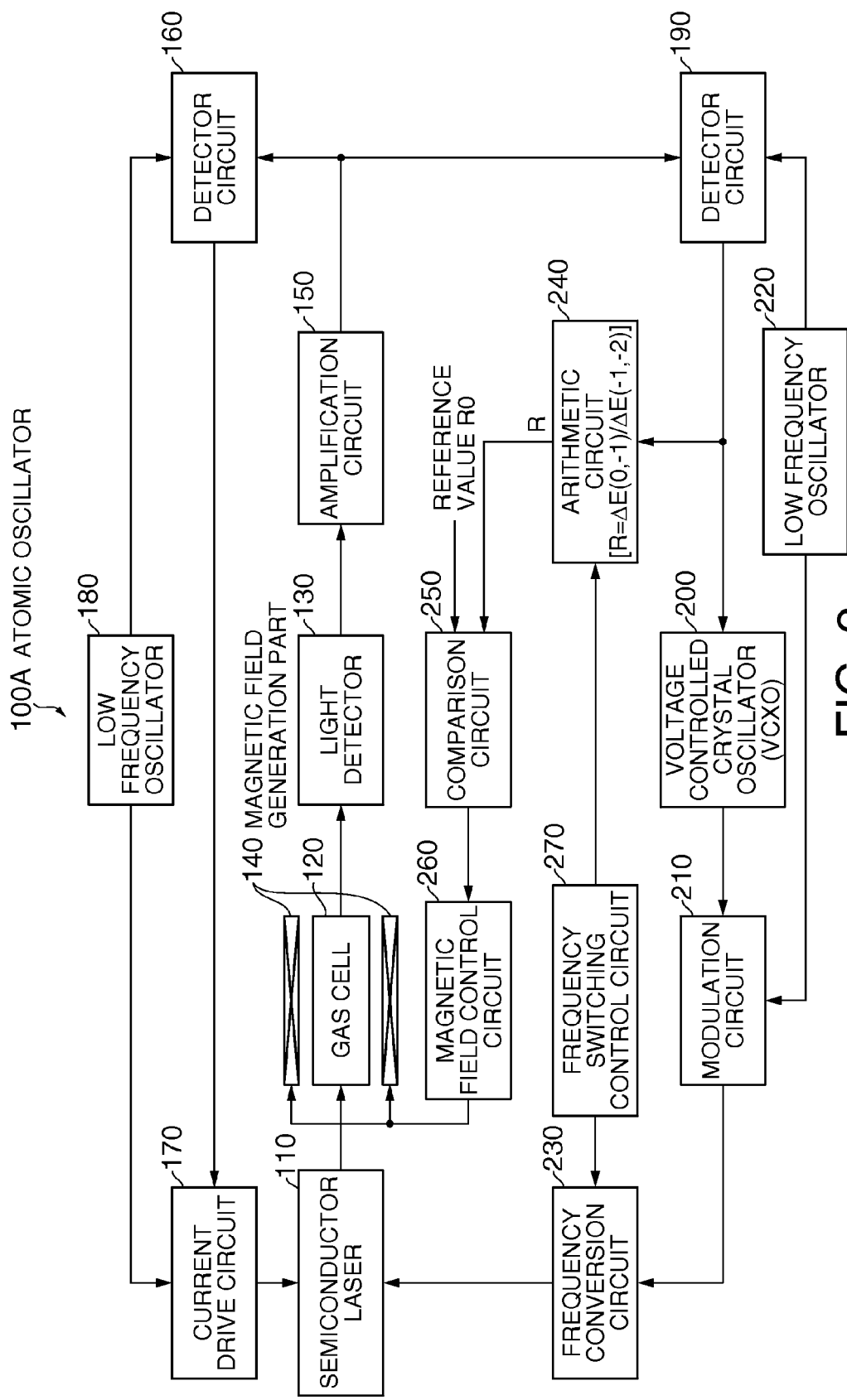
FIG. 2 is a view showing a structure of an atomic oscillator of a first embodiment.

FIG. 2 is a view showing a structure of an atomic oscillator of a first embodiment.

As shown in FIG. 2, an atomic oscillator 100A of the first embodiment includes a semiconductor laser 110, a gas cell 120, a light detector 130, a magnetic field generation part 140, an amplification circuit 150, a detector circuit 160, a current drive circuit 170, a low frequency oscillator 180, a detector circuit 190, a voltage controlled crystal oscillator (VCXO) 200, a modulation circuit 210, a low frequency oscillator 220, a frequency conversion circuit 230, an arithmetic circuit 240, a comparison circuit 250, a magnetic field control circuit 260 and a frequency switching control circuit 270.

The semiconductor laser 110 generates plural lights different in frequency from each other and irradiates the lights to the gas cell 120. Specifically, control is performed by a drive current outputted by the current drive circuit 170 so that the center wavelength $\lambda_0$ (center frequency $f_0$) of outgoing light of the semiconductor laser 110 coincides with the wavelength of a specific emission line of the alkali metal atom (for example, D2 line of the cesium atom). The semiconductor laser 110 is modulated by using the output signal of the frequency conversion circuit 230 as a modulation signal (modulation frequency fm). That is, the output signal (modulation signal) of the frequency conversion circuit 230 is superimposed on the drive current of the current drive circuit 170, and the semiconductor laser 110 generates the modulated light. The semiconductor laser 110 can be realized by, for example, an edge emitting laser or a surface emitting laser such as a vertical cavity surface emitting laser (VCSEL).

Figure 3:
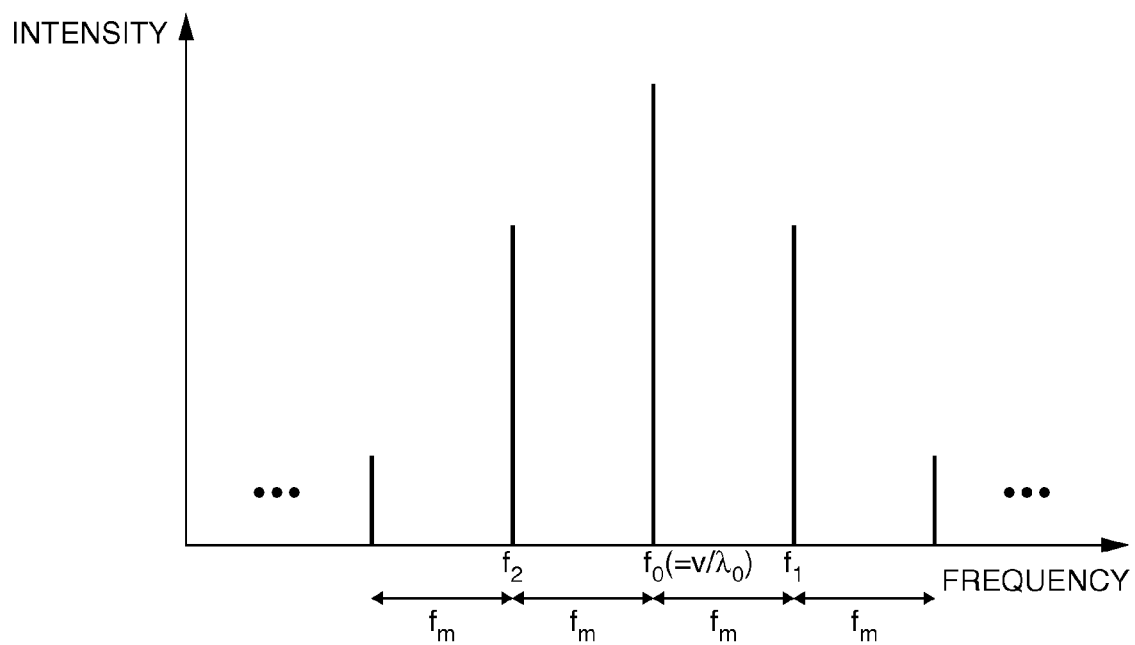
FIG. 3 is a schematic view showing a frequency spectrum of outgoing light of a semiconductor laser.

FIG. 3 is a schematic view showing a frequency spectrum of the outgoing light of the semiconductor laser 110. In FIG. 3, the lateral axis indicates the light frequency, and the vertical axis indicates the light intensity. As shown in FIG. 3, the outgoing light of the semiconductor laser 110 includes light having the center frequency $f_0$ ($=v/\lambda_0$: v denotes the light velocity, $\lambda_0$ denotes the light wavelength), and plural kinds of lights having frequencies at intervals of $f_m$ at both sides thereof.

The gas cell 120 is such that gaseous alkali metal atoms (sodium (Na) atoms, rubidium (Rb) atoms, cesium (Cs) atom, etc.) are sealed in a container.

The magnetic field generation part 140 is disposed adjacently to the gas cell 120, and generates a magnetic field to the gas cell 120. The intensity of the magnetic field generated by the magnetic field generation part 140 is controlled by the magnetic field control circuit 260. The magnetic field generation part 140 can be realized by using, for example, a coil. The intensity of the generated magnetic field can be adjusted by controlling the magnitude of current flowing through the coil by the magnetic field control circuit 260.

Figure 4:
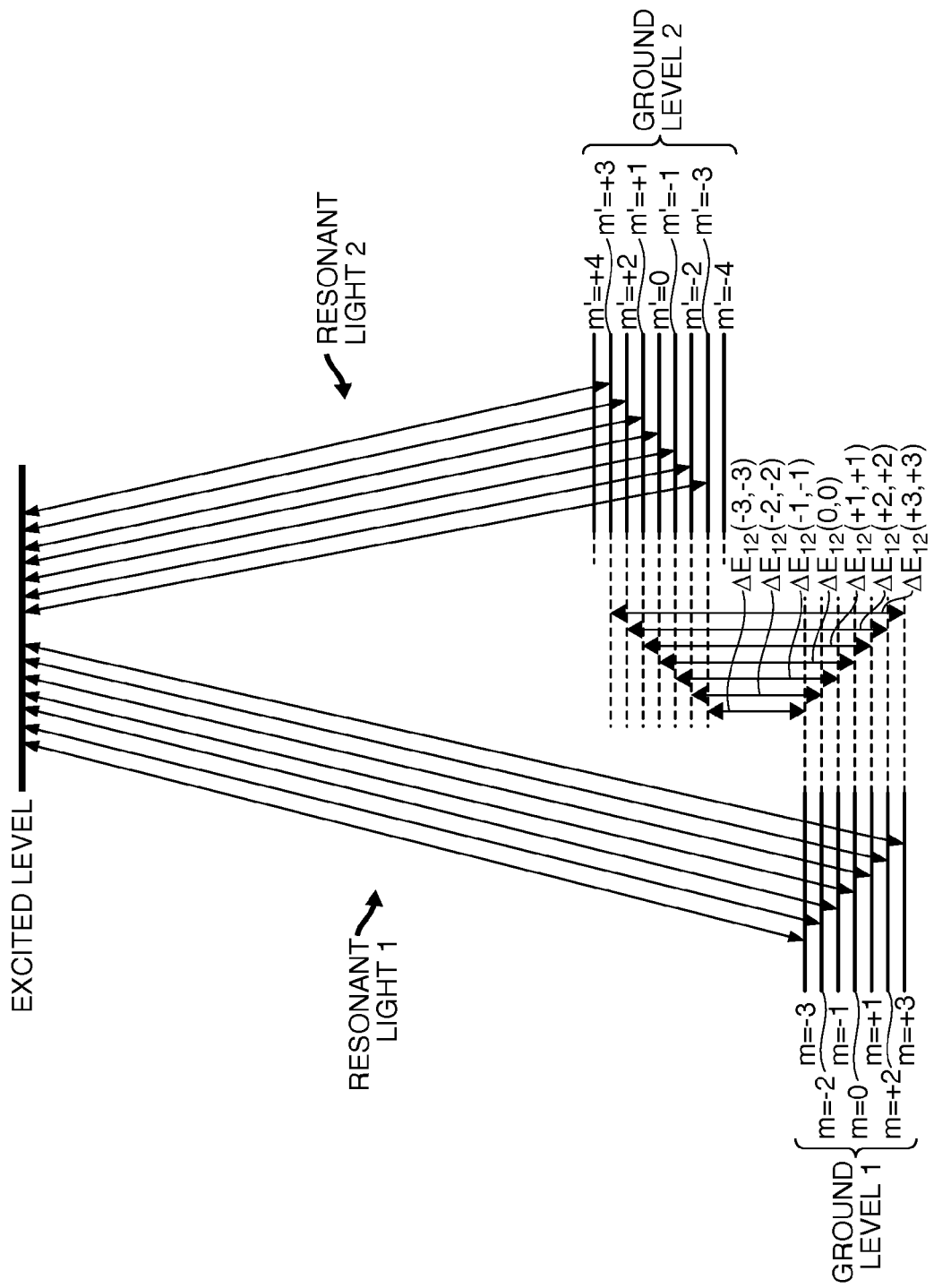
FIG. 4 is a view for explaining a relation between a Zeeman-split ground level of a cesium atom and a resonant light.

When the magnetic field is applied to the alkali metal atom included in the gas cell 120, two ground levels of the alkali metal atom are split into plural levels (Zeeman splitting levels) different in magnetic quantum number by energy splitting (Zeeman splitting) due to the magnetic field. Here, it is known that the number of Zeeman splitting levels changes according to the kind of the alkali metal atom. For example, when the cesium atom is used, as shown in FIG. 4, the ground level 1 is split into seven Zeeman splitting levels of magnetic quantum numbers m=−3, −2, −1, 0, +1, +2 and +3 in descending order of energy. On the other hand, the ground level 2 is split into nine Zeeman splitting levels of magnetic quantum numbers m'=+4, +3, +2, +1, 0, −1, −2, −3, −4 in descending order of energy. Accordingly, energy difference $\Delta E_{12}$ between the ground level 1 and the ground level 2 corresponding to each of (m,m')=(+3,+3), (+2,+2), (+1,+1), (0,0), (−1,−1), (−2,−2) and (−3,−3) is different from each other. Thus, two kinds of lights having a frequency difference, which coincides with a frequency corresponding to $\Delta E_{12}$ for any one of (m,m')=(+3, +3), (+2,+2), (+1,+1), (0,0), (−1,−1), (−2,−2) and (−3,−3), become the resonant light pair (resonant light 1, resonant light 2) and produce the EIT phenomenon in the cesium atom. Incidentally, in the following, an energy difference between the ground level 1 of magnetic quantum number m and the ground level 2 of magnetic quantum number m' is represented by $\Delta E_{12}(m,m')$. Besides, a frequency corresponding to $\Delta E_{12}(m,m')$ is represented by $f_{12}(m,m')$. Incidentally, a relation of $\Delta E_{12}(m,m') = h \cdot f_{12}(m,m')$ (h: Plank constant) is satisfied.

The light detector 130 detects the light (transmitted light) passing through the gas cell 120, and outputs a detection signal corresponding to the intensity of the light. As the number of alkali metal atoms causing the EIT phenomenon becomes large, the intensity of the light (transmitted light) passing through the gas cell 120 becomes high, and the voltage level of the output signal (detection signal) of the light detector 130 becomes high.

The output signal of the light detector 130 is amplified by the amplification circuit 150, and is inputted to the detector circuit 160 and the detector circuit 190. The detector circuit 160 uses an oscillation signal of the low frequency oscillator 180 oscillating at a low frequency of several Hz to several hundred Hz, and performs synchronous detection of the output signal of the amplification circuit 150.

The current drive circuit 170 generates the drive current of magnitude corresponding to the output signal of the detector circuit 160, and supplies it to the semiconductor laser 110 to control the center frequency $f_0$ (center wavelength $\lambda_0$) of the outgoing light of the semiconductor laser 110. Incidentally, in order to enable the detector circuit 160 to perform the synchronous detection, the oscillation signal (same signal as the oscillation signal supplied to the detector circuit 160) of the low frequency oscillator 180 is superimposed on the drive current generated by the current drive circuit 170.

The center frequency $f_0$ (center wavelength $\lambda_0$) of the light generated by the semiconductor laser 110 is finely adjusted to coincide with the wavelength of a specified emission line of the alkali metal atom (for example, the D2 line of the cesium atom) by a feedback loop passing through the semiconductor laser 110, the gas cell 120, the light detector 130, the amplification circuit 150, the detector circuit 160 and the current drive circuit 170.

The detector circuit 190 performs synchronous detection of the output signal of the amplification circuit 150 by using the oscillation signal of the low frequency oscillator 220 oscillating at a low frequency of several Hz to several hundred Hz. The oscillation frequency of the voltage controlled crystal oscillator (VCXO) 200 is finely adjusted according to the magnitude of the output signal of the detector circuit 190. The voltage controlled crystal oscillator (VCXO) 200 may oscillate at, for example, several MHz.

In order to enable the detector circuit 190 to perform the synchronous detection, the modulation circuit 210 modulates the output signal of the voltage controlled crystal oscillator (VCXO) 200 by using the oscillation signal (equal to the oscillation signal supplied to the detector circuit 190) of the low frequency oscillator 220 as a modulation signal. The modulation circuit 210 can be realized by a frequency mixer (mixer), an FM (Frequency Modulation) circuit, an AM (Amplitude Modulation) circuit or the like.

The frequency conversion circuit 230 performs frequency conversion of the output signal of the modulation circuit 210 according to the set frequency conversion rate. The frequency conversion circuit 230 can be realized by, for example, a PLL (Phase Locked Loop) circuit to multiply the frequency of the output signal of the modulation circuit 210 at a set multiplication ratio.

The output signal of the frequency conversion circuit 230 is superimposed on the drive current of the current drive circuit 170, and the semiconductor laser 110 is modulated by using the output signal of the frequency conversion circuit 230 as the modulation signal (modulation frequency $f_m$), and generates the outgoing light having the frequency spectrum as shown in FIG. 3.

In this embodiment, the frequency (modulation frequency $f_m$) of the output signal (modulation signal) of the frequency conversion circuit 230 is finely adjusted to generally accurately coincide with the frequency of ½ of the frequency $f_{12}(0,0)$ corresponding to the energy difference $\Delta E_{12}(0,0)$ between the two ground levels for (m,m')=(0,0) by a feedback loop passing through the semiconductor laser 110, the gas cell 120, the light detector 130, the amplification circuit 150, the detector circuit 190, the voltage controlled crystal oscillator (VCXO) 200, the modulation circuit 210 and the frequency conversion circuit 230. For example, when the alkali metal atom is the cesium atom, since $f_{12}(0,0)$ is 9.192631770 GHz, the modulation frequency $f_m$ is 4.596315885 GHz. That is, among plural lights emitted by the semiconductor laser as shown in FIG. 3, two kinds of lights having a frequency difference of 2×fm, for example, two kinds of lights in the primary side bands (light of a frequency $f_1=f_0+f_m$ and light of a frequency $f_2=f_0-f_m$) become the resonant light pair, and the feedback control is performed to produce the EIT phenomenon in the alkali metal atom.

Figure 5:
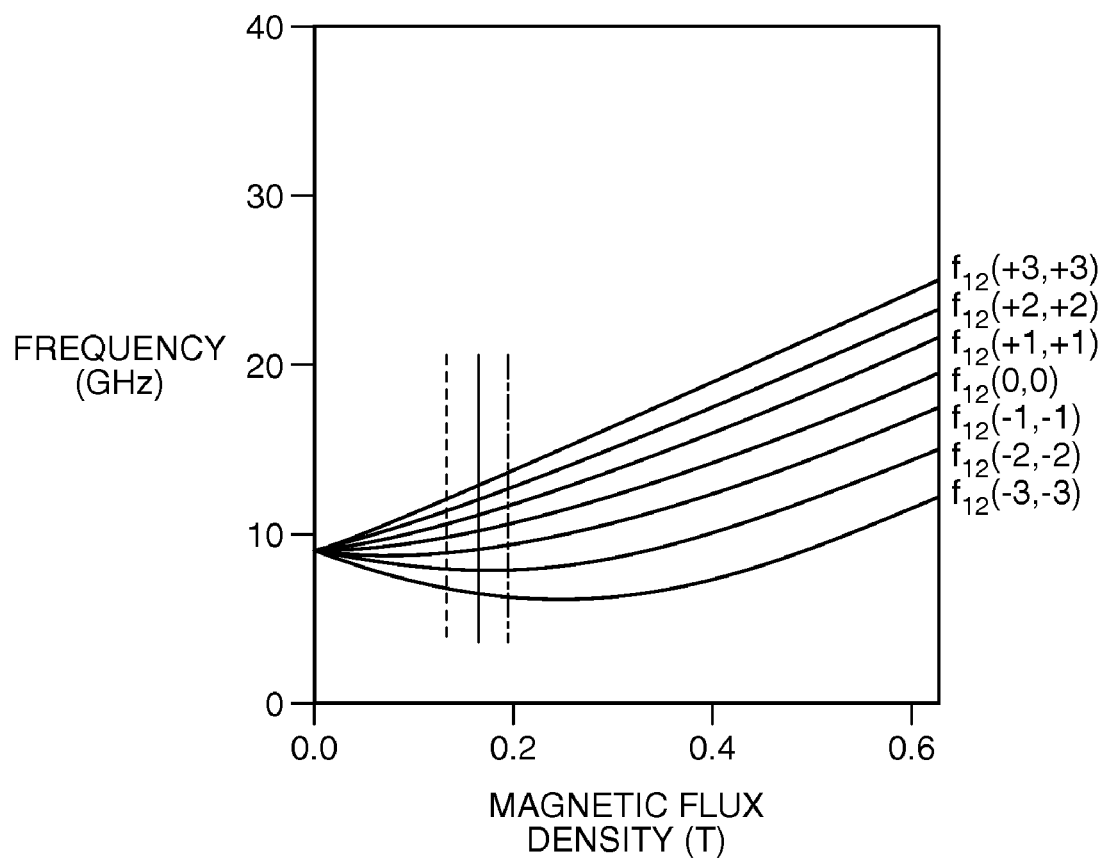
FIG. 5 is a view showing a relation between a magnetic flux density and $f_{12}(m,m)$ for each magnetic quantum number m when a magnetic field is applied to a cesium atom.

When the intensity of the magnetic field applied to the alkali metal atom is changed, each of the Zeeman splitting levels of the ground level 1 and the ground level 2 is changed, and the frequency $f_{12}(m,m')$ corresponding to the energy difference $\Delta E_{12}(m,m')$ of the two ground levels is also changed according to the intensity of the magnetic field. As an example, a relation between a magnetic flux density and $f_{12}(m,m')$ when a magnetic field is applied to the cesium atom is shown in FIG. 5. In FIG. 5, the lateral axis indicates the magnetic flux density, and the vertical axis indicates the frequency. When the magnetic flux density is 0 (when the magnetic field is not applied to the cesium atom), since Zeeman splitting does not occur, each of the ground level 1 and the ground level 2 degenerates to one level. Thus, all of $f_{12}(+3,+3)$, $f_{12}(+2,+2)$, $f_{12}(+1,+1)$, $f_{12}(0,0)$, $f_{12}(-1,-1)$, $f_{12}(-2,-2)$ and $f_{12}(-3,-3)$ have the same value (9.192631770 GHz). On the other hand, when the magnetic field is applied to the cesium atom, Zeeman splitting occurs, and $f_{12}(+3,+3)$, $f_{12}(+2,+2)$, $f_{12}(+1,+1)$, $f_{12}(0,0)$, $f_{12}(-1,-1)$, $f_{12}(-2,-2)$ and $f_{12}(-3,-3)$ are respectively changed according to the magnetic flux density. Accordingly, when feedback control is performed so that the frequency difference between the resonant light pair coincides with any one of $f_{12}(+3,+3)$, $f_{12}(+2,+2)$, $f_{12}(+1,+1)$, $f_{12}(0,0)$, $f_{12}(-1,-1)$, $f_{12}(-2,-2)$ and $f_{12}(-3,-3)$, even if the magnetic field of constant intensity is accurately generated, when a magnetic field due to disturbance is applied, the frequency difference between the resonant light pair is changed, and the frequency accuracy is deteriorated.

Figure 6A:
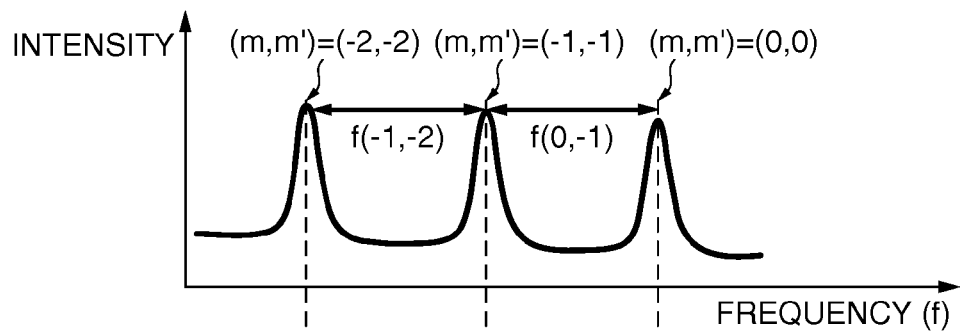
FIGS. 6A to 6C are views showing an example of the state of change of an EIT signal due to intensity change of the magnetic field applied to the cesium atom.
Figure 6B:
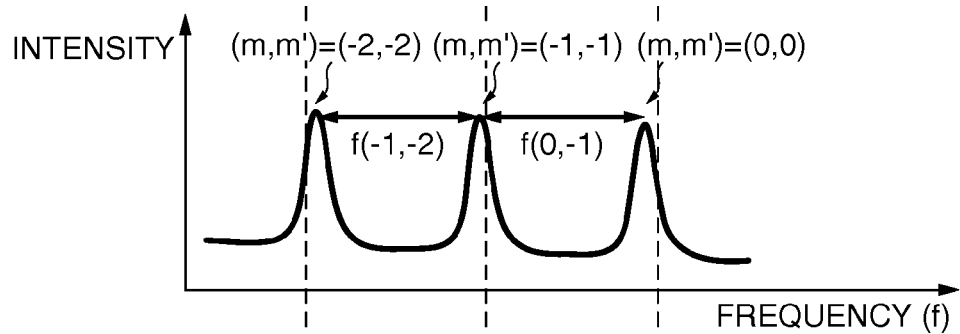
Figure 6C:
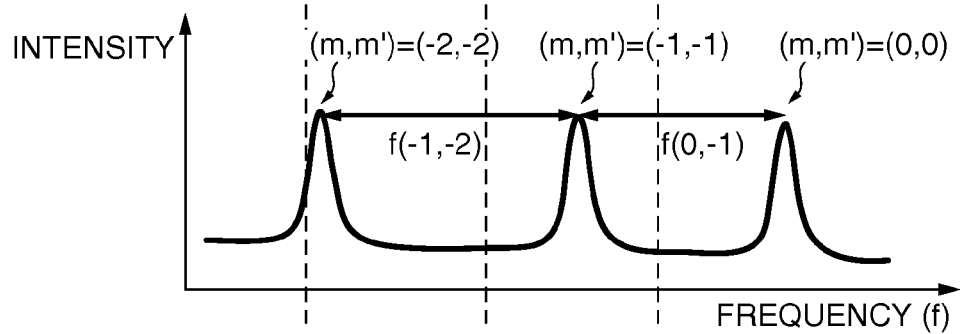

FIG. 6A to FIG. 6C are views showing an example of the state of change of an EIT signal due to the change of intensity of the magnetic field applied to the cesium atom. In FIG. 6A to FIG. 6C, the horizontal axis indicates the frequency, and the vertical axis indicates the signal intensity. In the following, a difference ($\Delta E_{12}(m_1,m_1) - \Delta E_{12}(m_2,m_2)$) between an energy difference $\Delta E_{12}(m_1,m_1)$ between the ground level 1 of magnetic quantum number $m=m_1$ and the ground level 2 of magnetic quantum number $m'=m_1$ and an energy difference $\Delta E_{12}(m_2,m_2)$ between the ground level 1 of magnetic quantum number $m=m_2$ and the ground level 2 of magnetic quantum number $m'm_2$ is represented by $\Delta E(m_1, m_1)$. Besides, a frequency corresponding to $\Delta E(m_1,m_2)$ is represented by $f(m_1,m_2)$.

FIG. 6A shows, in sequence from the left, the EIT signals for $(m,m')=(-2,-2)$, $(-1,-1)$ and $(0,0)$ when the magnetic field of magnetic flux density indicated by a solid line of FIG. 5 is applied to the cesium atom. As shown in FIG. 6A, the difference between the frequency at which the EIT signal for $(m,m')=(-1,-1)$ becomes the peak and the frequency at which the EIT signal for $(m,m')=(-2,-2)$ becomes the peak coincides with the frequency $f(-1,-2)$ corresponding to $\Delta E(-1,-2)$. Besides, the difference between the frequency at which the EIT signal for $(m,m')=(0,0)$ becomes the peak and the frequency at which the EIT signal for $(m,m')=(-1,-1)$ becomes the peak coincides with the frequency $f(0,-1)$ corresponding to $\Delta E(0,-1)$.

FIG. 6B shows, in sequence from the left, the EIT signals for $(m,m')=(-2,-2)$, $(-1,-1)$ and $(0,0)$ when the magnetic field of magnetic flux density indicated by a dotted line of FIG. 5 is applied to the cesium atom (when the magnetic field is lower than that of FIG. 6A). In FIG. 6B, the frequency at which the EIT signal for $(m,m')=(-2,-2)$ becomes the peak is higher than that in the case of FIG. 6A, and the frequency at which each of the EIT signals for $(m,m')=(-1,-1)$ and $(0,0)$ becomes the peak is lower than that in the case of FIG. 6A. As a result, the ratio of $f(0,-1)$ to $f(-1,-2)$, that is, the ratio R of $\Delta E(0,-1)$ to $\Delta E(-1,-2)(R=\Delta E(0,-1)/\Delta E(-1,-2))$ is larger than that in the case of FIG. 6A.

FIG. 6C shows, in sequence from the left, the EIT signals for $(m,m')=(-2,-2)$, $(-1,-1)$ and $(0,0)$ when the magnetic field of magnetic flux density indicated by an alternate long and short dash line of FIG. 5 is applied to the cesium atom (when the magnetic field is higher than that of FIG. 6A). In FIG. 6C, the frequency at which each of the EIT signals for $(m,m')=(-2,-2), (-1,-1)$ and $(0,0)$ becomes the peak is higher than that in the case of FIG. 6A. As a result, the ratio of $f(0,-1)$ to $f(-1,-2)$, that is, the ratio R of $\Delta E(0,-1)$ to $\Delta E(-1,-2)$ $(R=\Delta E(0,-1)/\Delta E(-1,-2))$ is smaller than that in the case of FIG. 6A.

Figure 7B:
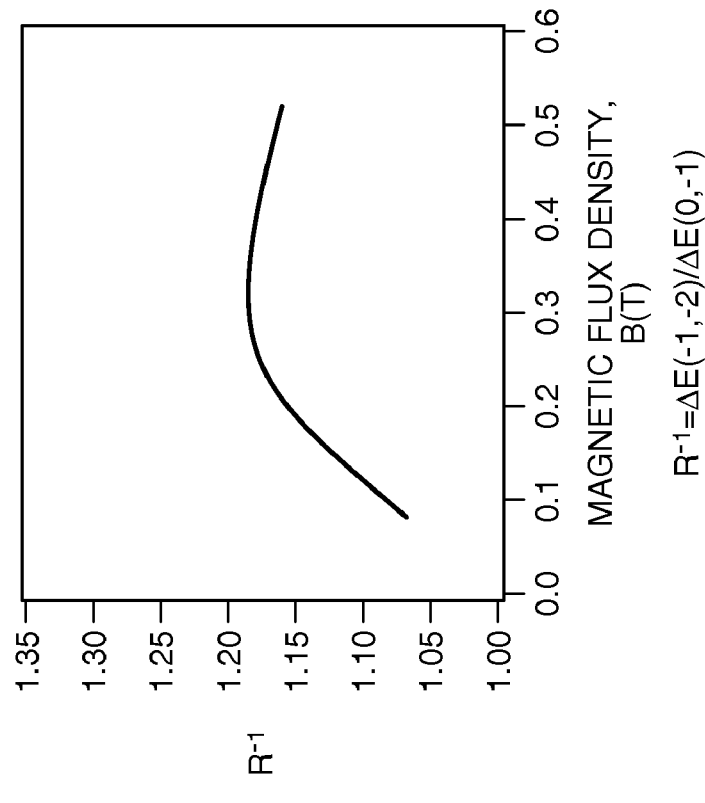
FIGS. 7A and 7B are views showing a relation between the density of magnetic flux applied to the cesium atom and $R=\Delta E(0,-1)/\Delta E(-1,-2)$ or $R^{-1}=\Delta E(-1,-2)/\Delta E(0,-1)$.
Figure 7A:
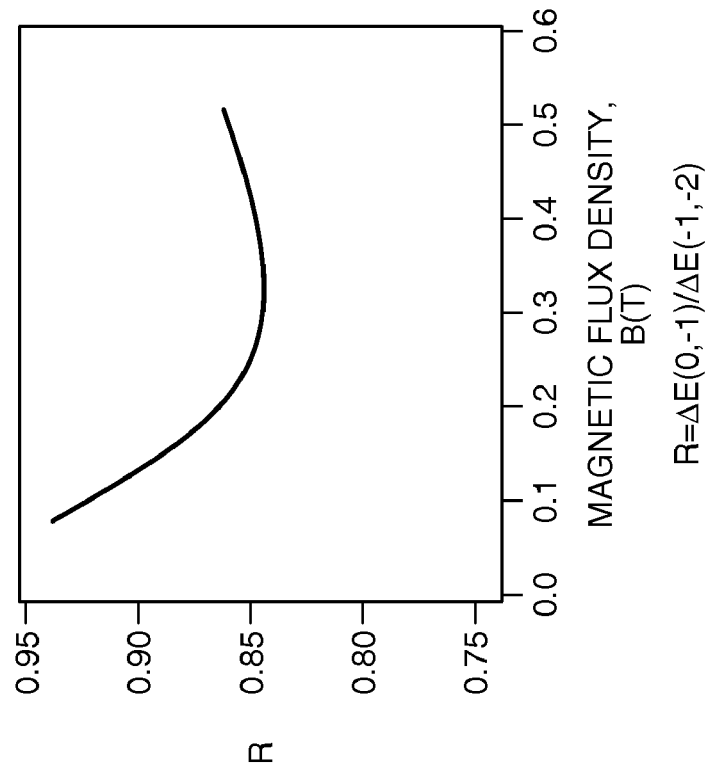

FIG. 7A is a view showing a relation between the density of magnetic flux applied to the cesium atom and $R=\Delta E(0,-1)/\Delta E(-1,-2)$. In FIG. 7A, the horizontal axis indicates the magnetic flux density and the vertical axis indicates the value of R. As shown in FIG. 7A, R monotonically decreases in the range in which the magnetic flux density is smaller than about 0.3 T, becomes minimum when the magnetic flux density is approximately 0.3 T, and monotonically increases when the magnetic flux density is larger than about 0.3 T. Accordingly, when the magnetic field is changed in only one of the specified range in which the magnetic field is lower than 0.3 T and the specified range in which the magnetic field is higher than 0.3 T, the intensity of the magnetic field is uniquely determined for R. That is, when R is obtained, the intensity of the magnetic field at that time is known. Thus, the feedback control can be performed so that the intensity of the magnetic field becomes a specified magnitude.

Besides, as is apparent from FIG. 7A, in the range in which the magnetic flux density is about 0.1 T to about 0.2 T, since the change of R relative to the change of the magnetic flux density is particularly large, the feedback control of the magnetic field intensity is easy. Then, in this embodiment, for example, the ratio R of $\Delta E(0,-1)$ to $\Delta E(-1,-2)$ is obtained, and the feedback control is performed so that the magnetic flux density becomes a specified value (for example, 0.15 T) in the range of about 0.1 T to about 0.2 T).

Specifically, in order to sequentially generate the resonant light pair for each of $(m,m')=(0,0), (-1,-1)$ and $(-2,-2)$, the frequency switching control circuit 270 switches the frequency conversion rate of the frequency conversion circuit 230 in three ways to $N_0$, $N_1$ and $N_2$ at specified timings. For example, the resonant light pair for $(m,m')=(0,0)$ is generated at the time of normal operation, and the resonant light pair for each of $(m,m')=(0,0), (-1,-1)$ and $(-2,-2)$ is sequentially generated at the time of adjustment of magnetic field intensity. For example, a free-running counter to repeat a count operation at regular periods is provided in the frequency switching control circuit 270, and the timing signal for adjusting the magnetic field intensity can be periodically generated.

In order to obtain the information of intensity of the present magnetic field, the arithmetic circuit 240 calculates the ratio R of $\Delta E(0,-1)$ to $\Delta E(-1,-2)(R=\Delta E(0,-1)/\Delta E(-1,-2))$ based on the timing signal from the frequency switching control circuit 270. $R=\Delta E(0,-1)/\Delta E(-1,-2)$ can be modified as indicated by following expression (1).

$$R = \frac{\Delta E(0,-1)}{\Delta E(-1,-2)} \quad (1)$$

$$= \frac{\Delta E_{12}(0,0) - \Delta E_{12}(-1,-1)}{\Delta E_{12}(-1,-1) - \Delta E_{12}(-2,-2)}$$

$$= \frac{h \cdot f_{12}(0,0) - h \cdot f_{12}(-1,-1)}{h \cdot f_{12}(-1,-1) - h \cdot f_{12}(-2,-2)}$$

$$= \frac{f_{12}(0,0) - f_{12}(-1,-1)}{f_{12}(-1,-1) - f_{12}(-2,-2)}$$

When the oscillation frequencies of the voltage controlled crystal oscillator (VCXO) 200 in the stable state (lock state) for $(m,m')=(0,0), (-1,-1)$ and $(-2,-2)$ are $f_{v0}, f_{v1}$ and $f_{v2}$, since $f_{12}(0,0)=2\times N_0 \times f_{v0}$, $f_{12}(-1,-1)=2\times N_1 \times f_{v1}$, and $f_{12}(-2,-2)=2\times N_2 \times f_{v2}$ are established, the expression (1) can be modified as indicated by following expression (2).

$$R = \frac{2 \cdot N_0 \cdot f_{v0} - 2 \cdot N_1 \cdot f_{v1}}{2 \cdot N_1 \cdot f_{v1} - 2 \cdot N_2 \cdot f_{v2}} \quad (2)$$

$$= \frac{N_0 \cdot f_{v0} - N_1 \cdot f_{v1}}{N_1 \cdot f_{v1} - N_2 \cdot f_{v2}}$$

Further, when the oscillation control voltages of the voltage controlled crystal oscillator (VCXO) 200 in the stable state (lock state) for $(m,m')=(0,0), (-1,-1)$ and $(-2,-2)$ are $V_{c0}$, $V_{c1}$ and $V_{c2}$, since $f_{v0}=\alpha \times V_{c0}$, $f_{v1}=\alpha \times V_{c1}$ and $f_{v1}=\alpha \times V_{c1}$ are established by using coefficient $\alpha$, the expression (2) can be modified as indicated by following expression (3).

$$R = \frac{N_0 \cdot \alpha \cdot V_{c0} - N_1 \cdot \alpha \cdot V_{c1}}{N_1 \cdot \alpha \cdot V_{c1} - N_2 \cdot \alpha \cdot V_{c2}} \quad (3)$$
$$= \frac{N_0 \cdot V_{c0} - N_1 \cdot V_{c1}}{N_1 \cdot V_{c1} - N_2 \cdot V_{c2}}$$

In the expression (3), since $N_0$, $N_1$ and $N_2$ are, for example, multiplication ratios of PLL, they are fixed values. Accordingly, when the oscillation control voltages $V_{c0}$, $V_{c1}$ and $V_{c2}$ of the voltage controlled crystal oscillator (VCXO) 200 are known, R can be calculated.

Then, first, when the frequency conversion rate of the frequency conversion circuit 230 is $N_0$, the arithmetic circuit 240 acquires the oscillation control voltage $V_{c0}$ (example of the first profile information) at a specified timing. Next, the arithmetic circuit 240 acquires oscillation control voltage $V_{c1}$ (example of the second profile information) at a specified timing synchronous with a timing when the frequency switching control circuit 270 switches the frequency conversion rate of the frequency conversion circuit 230 from $N_0$ to $N_1$. Next, the arithmetic circuit 240 acquires the oscillation control voltage $V_{c2}$ (example of the third profile information) at a specified timing synchronous with a timing when the frequency conversion control circuit 270 switches the frequency conversion rate of the frequency conversion circuit 230 from $N_1$ to $N_2$. Here, the specified timing may be any timing after the stable state (lock state) occurs in each of the settings in which the frequency conversion rates of the frequency conversion circuit 230 are $N_0$, $N_1$ and $N_2$. For example, when a specified time passes after the frequency conversion rate of the frequency conversion circuit 230 is switched, it may be regarded that the stable state (lock state) occurs. Alternatively, when the change width of the control voltage of the voltage controlled crystal oscillator (VCXO) 200 is converged into a specified range, it may be regarded that the stable state (lock state) occurs. In this way, the arithmetic circuit 240 acquires $V_{c0}$, $V_{c1}$ and $V_{c2}$ in the expression (3), and calculates R based on the expression (3).

The comparison circuit 250 compares R calculated by the arithmetic circuit 240 with a reference value R0, and supplies a comparison result (difference) to the magnetic field control circuit 260. Here, in this embodiment, the reference value R0 is, for example, the value of $\Delta E(0,-1)/\Delta E(-1,-2)$ when the magnetic flux density is 0.15 T in the state where magnetic field applied by disturbance is 0, and the value is previously obtained by calculation.

The magnetic field control circuit 260 controls the intensity of the magnetic field generated by the magnetic field generation part 140 based on the comparison result of the comparison circuit 250, so that the calculation result of the arithmetic circuit 240 coincides with R0. For example, when the magnetic field generation part 140 is a coil, the magnetic field control circuit 260 can control the intensity of the magnetic field by changing the amount of current flowing through the coil. Here, when R of the calculation result of the arithmetic circuit 240 is larger than R0, the magnetic field control circuit 260 increases the intensity of the magnetic field, which is generated by the magnetic field generation part 140, by R−R0. On the other hand, when R of the calculation result of the arithmetic circuit 240 is smaller than R0, the magnetic field control circuit 260 decreases the intensity of the magnetic field, which is generated by the magnetic field generation part 140, by R0−R. A correspondence table of R−R0 and the control amount of the magnetic field intensity is stored, and the magnetic field control circuit 260 may perform control corresponding to R of the calculation result by referring to this table. In this way, the control can be performed so that the intensity of the magnetic field applied to the gas cell 120 always becomes constant.

Incidentally, the ratio of $\Delta E(-1,-2)$ to $\Delta E(0,-1)$, that is, $R^{-1}=\Delta E(-1,-2)/\Delta E(0,-1)$ is calculated (FIG. 7B), and the feedback control of the magnetic field intensity can be performed.

Incidentally, the semiconductor laser 110 and the magnetic field generation part 140 respectively correspond to the light source 10 and the magnetic field generation part 40 of FIG. 1. Besides, the structure including the light detector 130 and the amplification circuit 150 corresponds to the light detection part 30 of FIG. 1. Besides, the structure including the detector circuit 160, the current drive circuit 170, the low frequency oscillator 180, the detector circuit 190, the voltage controlled crystal oscillator (VCXO) 200, the modulation circuit 210, the low frequency oscillator 220, the frequency conversion circuit 230 and the frequency switching control circuit 270 correspond to the frequency control part of FIG. 1. Besides, the voltage controlled crystal oscillator (VCXO) 200, the frequency conversion circuit 230 and the frequency switching control circuit 270 respectively correspond to the voltage control oscillator 52, the frequency conversion part 54 and the frequency switching control part 56 of FIG. 1. Besides, the structure including the arithmetic circuit 240, the comparison circuit 250 and the magnetic field control circuit 260 correspond to the magnetic field control part 60 of FIG. 1.

As described above, in the atomic oscillator of the first embodiment, for example, as shown in FIG. 5, attention is paid to the fact that with respect to the change of the magnetic field intensity, the degree of the change of the energy difference between the two ground levels for the three different magnetic quantum numbers m1, m2 and m3, that is, $\Delta E_{12}$(m1,m1), $\Delta E_{12}$(m2,m2) and $\Delta E_{12}$(m3,m3) are different from each other, and attention is paid to the fact that the intensity of the magnetic field and the value of R={$\Delta E_{12}$(m1,m1)−$\Delta E_{12}$(m2,m2)}/{$\Delta E_{12}$(m2,m2)−$\Delta E_{12}$(m3,m3)} are in one-to-one correspondence with each other in the specified range (for example, the range of about 0.1 T to about 0.2 T in the case of the cesium atom), and the magnetic field intensity is adjusted. Specifically, the resonant light pair to cause the transition between the two ground levels corresponding to (m,m')=(0, 0), (−1,−1) and (−2,−2) is sequentially generated by the semiconductor laser 110, and based on the detection signal of the light detector 130, the oscillation control voltages $V_{c0}$, $V_{c1}$ and $V_{c2}$ capable of specifying $\Delta E_{12}$(0,0), $\Delta E_{12}$(−1,−1) and $\Delta E_{12}$(−2,−2) are sequentially acquired, R={$\Delta E_{12}$(0,0)−$\Delta E_{12}$(−1,−1)}/{$\Delta E_{12}$(−1,−1)−$\Delta E_{12}$(−2,−2)} is calculated. The calculation result R is compared with the reference value $R_0$ to specify the change amount of the magnetic field intensity, and the control is performed so that the intensity of the magnetic field becomes constant. According to the atomic oscillator of the first embodiment of the structure as described above, the change amount of the intensity of the magnetic field applied to the alkali metal atom is certainly grasped, and the change of the magnetic field intensity can be suppressed within a very small range. Thus, the frequency accuracy can be improved as compared with the related art.

Besides, according to the atomic oscillator of the first embodiment, it is not necessary to apply a weak magnetic field to an alkali metal atom unlike the related art, and the amount of magnetic field change due to disturbance can be relatively reduced as compared with the related art. Therefore, the stable control of the magnetic field is easy, and the frequency stability can be raised.

MODIFIED EXAMPLE

Figure 8B:
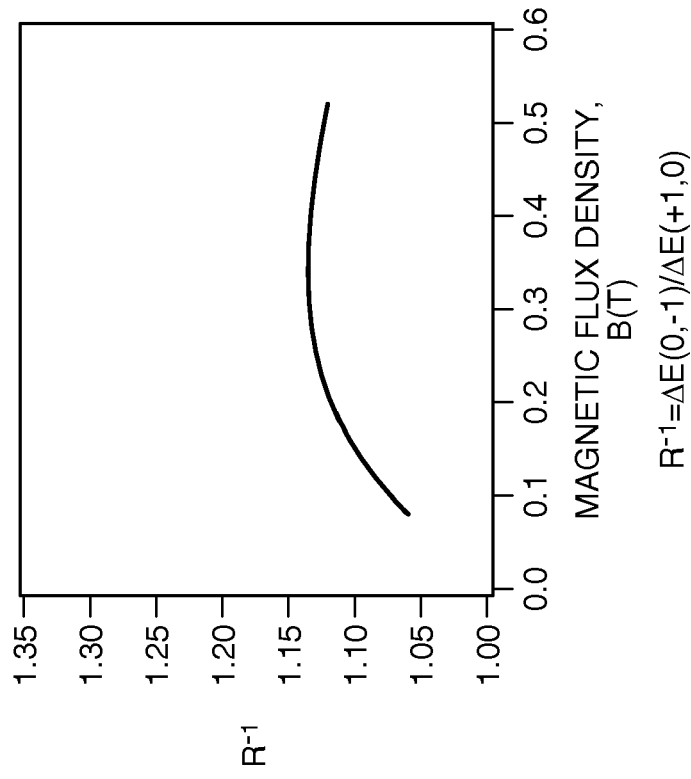
FIGS. 8A and 8B are views showing a relation between the density of magnetic flux applied to the cesium atom and $R=\Delta E(+1,0)/\Delta E(0,-1)$ or $R^{-1}=\Delta E(0,-1)/\Delta E(+1,0)$.
Figure 8A:
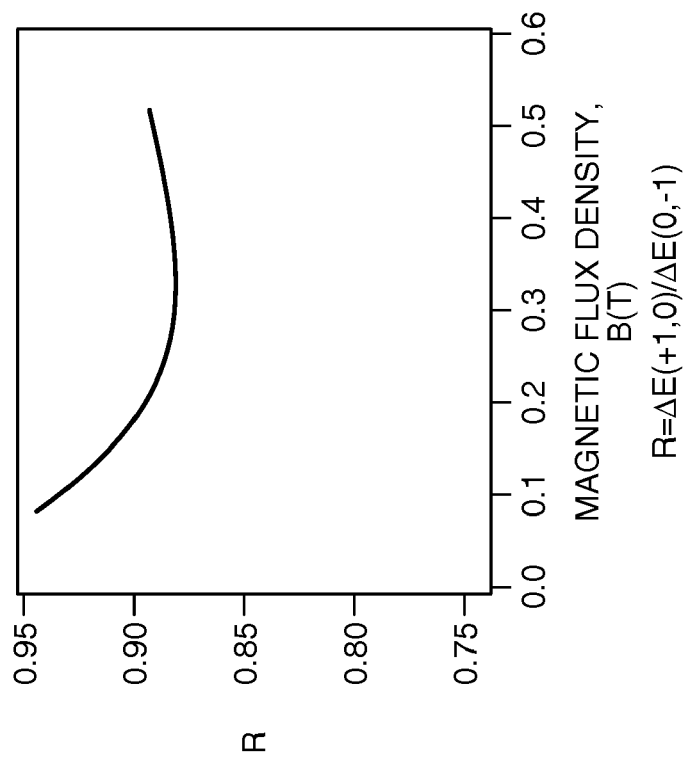

In the first embodiment, although (m,m')=(0,0), (−1,−1) and (−2,−2) are selected and R is calculated, arbitrary three pairs of (m,m') (where, m=m') are selected and R can be calculated. For example, a modification may be made such that the frequency switching control circuit 270 switches the frequency conversion rate of the frequency conversion circuit 230 in three ways to generate resonant light pairs for (m,m')= (+1,+1), (0,0) and (−1,−1), and the arithmetic circuit 240 calculates R=ΔE(+1,0)/ΔE(0,−1) or $R^{-1}$=ΔE(0,−1)/ΔE(+1,0) (FIG. 8A, FIG. 8B).

Figure 9B:
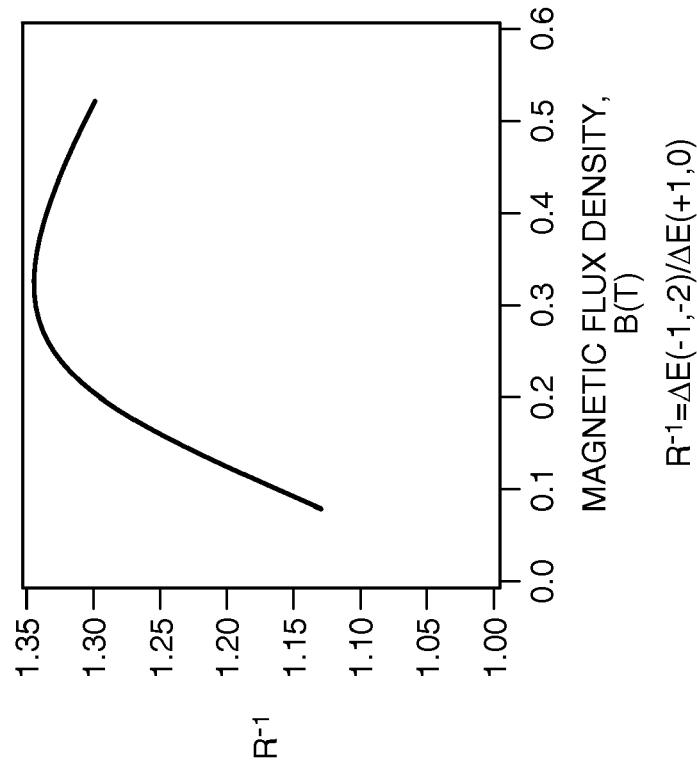
FIGS. 9A and 9B are views showing a relation between the density of magnetic flux applied to the cesium atom and $R=\Delta E(+1,0)/\Delta E(-1,-2)$ or $R^{-1}=\Delta E(-1,-2)/\Delta E(+1,0)$.
Figure 9A:
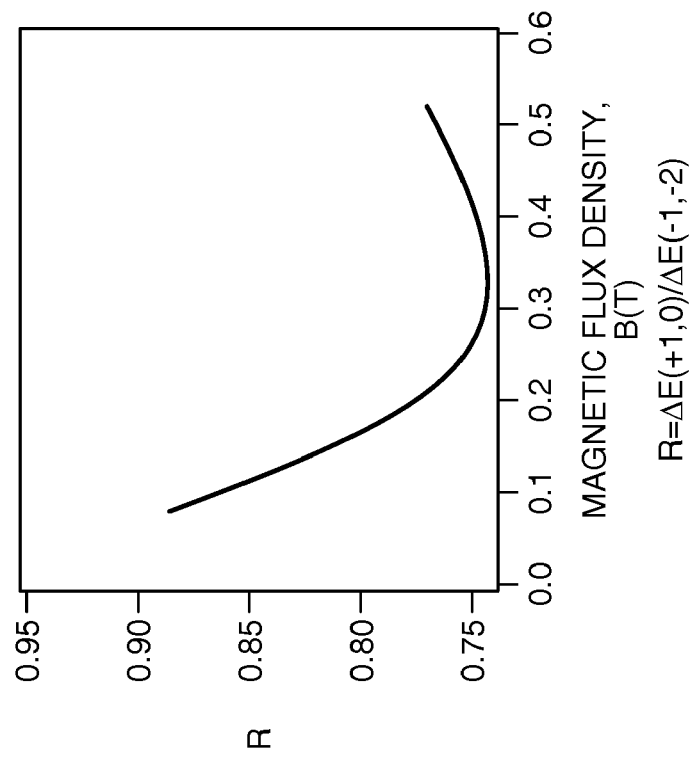

Besides, in the first embodiment, although three pairs of (m,m') are selected and R is calculated, four or more pairs of (m,m') (where, m=m') are selected and R can be calculated. For example, a modification may be made such that the frequency switching circuit 270 switches the frequency conversion rate of the frequency conversion circuit 230 in four ways to generate resonant light pairs for (m,m')=(+1,+1), (0,0), (−1,−1) and (−2,−2), and the arithmetic circuit calculates R=ΔE(+1,0)/ΔE(−1,−2) or $R^{-1}$=ΔE(−1,−2)/ΔE(+1,0) (FIG. 9A, FIG. 9B). By doing so, since the change of R or $R^{-1}$ within the range in which the magnetic flux density of the magnetic field applied to the gas cell 120 is about 0.1 T to about 0.2 T becomes further large, the feedback control of the magnetic field intensity can be further stabilized.

Figure 10:
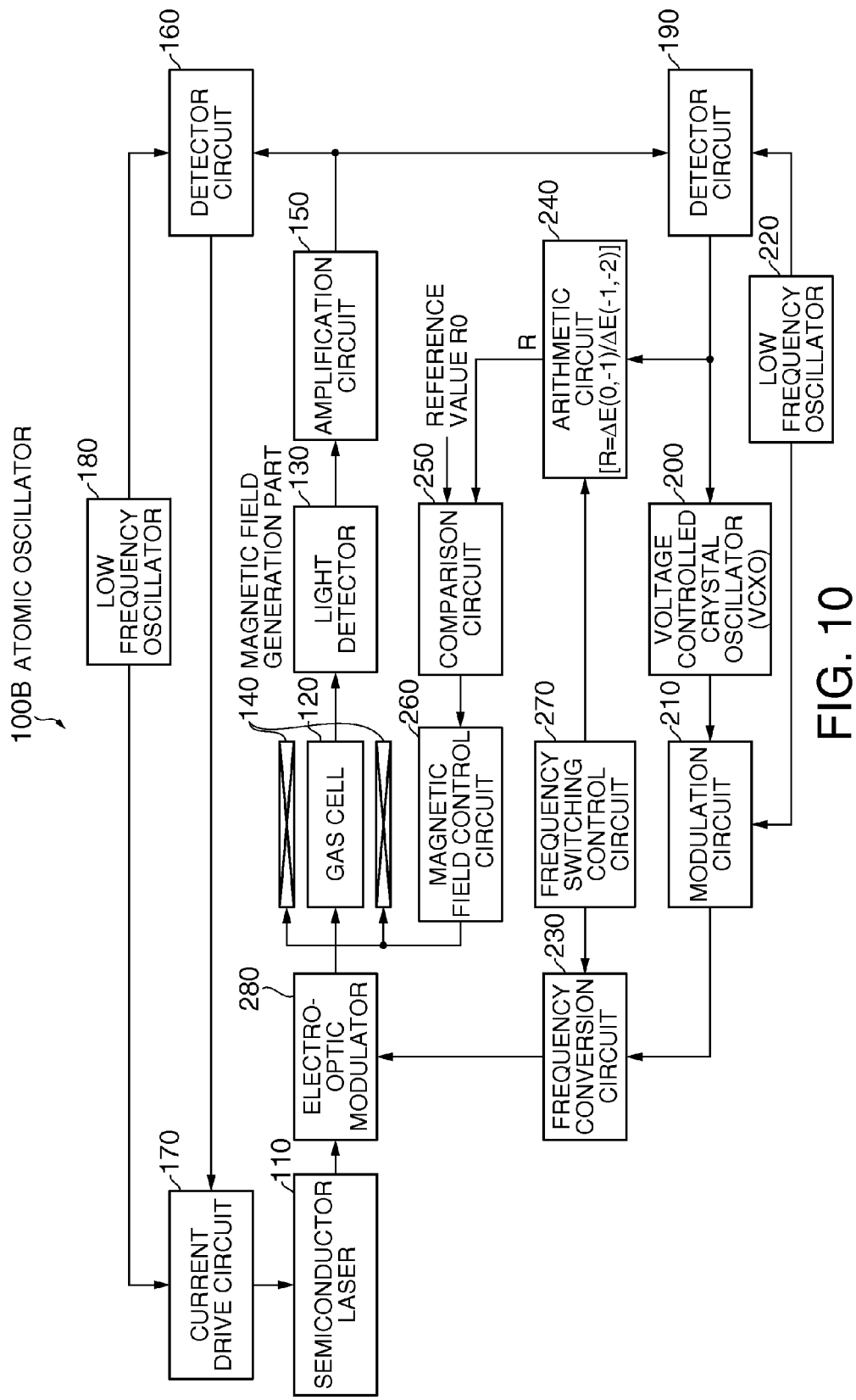
FIG. 10 is a view showing a structure of a modified example of the atomic oscillator of the first embodiment.

Besides, the structure of the atomic oscillator 100A of the first embodiment can be modified into a structure as shown in FIG. 10. An atomic oscillator 100B of a modified example shown in FIG. 10 is such that an electro-optic modulator (EOM) 280 is added to the atomic oscillator 100A shown in FIG. 2. As shown in FIG. 10, in the atomic oscillator 100B, a semiconductor laser 110 is not modulated by an output signal (modulation signal) of a frequency conversion circuit 230, and generates light of a single frequency $f_0$. The light of the frequency $f_0$ is incident on the electro-optic modulator (EOM) 280, and is modulated by the output signal (modulation signal) of the frequency conversion circuit 230. As a result, light having a frequency spectrum similar to that of FIG. 3 can be generated. Since the other structure of the atomic oscillator 100B shown in FIG. 10 is the same as that of the atomic oscillator 100A shown in FIG. 2, the same reference numeral is denoted, and its description is omitted. Incidentally, the structure including the semiconductor laser 110 and the electro-optic modulator (EOM) 280 corresponds to the light source 10 of FIG. 1. The other correspondence relation is the same as that of the atomic oscillator 100A shown in FIG. 2. Incidentally, an acousto-optic modulator (AOM) may be used instead of the electro-optic modulator (EOM) 280.

Also by the structure of the modified example, the atomic oscillator having the same functions and effects as those of the atomic oscillator 100A can be realized.

(2) Second Embodiment

Figure 11:
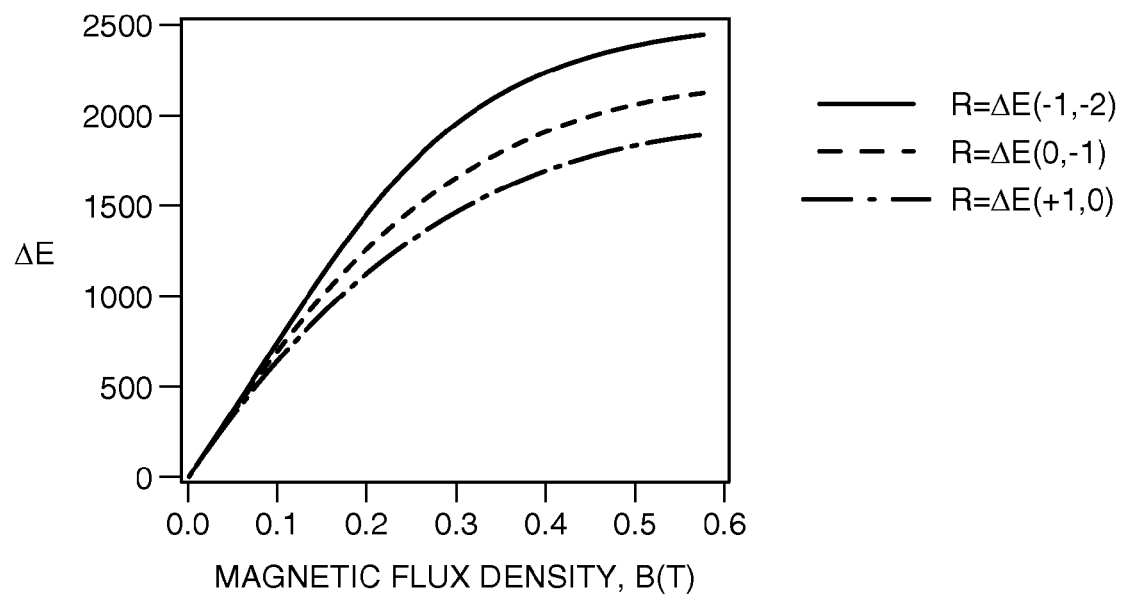
FIG. 11 is a view showing a relation between the density of magnetic flux applied to the cesium atom and $R=\Delta E(-1,-2)$, $\Delta E(0,-1)$, $\Delta E(+1,0)$.

FIG. 11 is a view showing a relation between magnetic flux and ΔE(−1,−2), ΔE(0,−1), ΔE(+1,0) when frequency $f_{12}$(0,0), $f_{12}$(−1,−1), $f_{12}$(−2,−2) corresponding to $\Delta E_{12}$ for each of (m,m') =(0,0), (−1,−1) and (−2,−2) is in the relation of FIG. 5. In FIG. 11, the lateral axis indicates the magnetic flux density, and the vertical axis indicates the magnitude of the energy. Besides, ΔE(−1,−2), ΔE(0,−1) and ΔE(+1,0) are respectively indicated by a solid line, a broken line and an alternate long and short dash line.

As shown in FIG. 11, all of ΔE(−1,−2), ΔE(0,−1) and ΔE(+1,0) monotonically increase with respect to the magnetic flux density. Accordingly, when the intensity of the magnetic field is uniquely determined for anyone of ΔE(−1,−2), ΔE(0,−1) and ΔE(+1,0). That is, when any one of ΔE(−1,−2), ΔE(0,−1) and ΔE(+1,0) is obtained at a specified time, since the intensity of the magnetic field at that time is known, feedback control can be performed so that the intensity of the magnetic field has a specified magnitude and is constant.

Incidentally, as is apparent from FIG. 11, in the range in which the magnetic flux is about 0.1 T to about 0.2 T, since the change of ΔE(−1,−2), ΔE(0,−1) and ΔE(+1,0) is particularly large with respect to the change of intensity of the magnetic flux density, the feedback control of the magnetic field intensity is easy. Further, in the range in which the magnetic flux density is about 0.1 T to about 0.2 T, the change rate of ΔE(−1,−2) is larger than the change rate of ΔE(0,−1) and ΔE(+1,0). Then, in the second embodiment, ΔE(−1,−2) is obtained, and the feedback control is performed so that the magnetic flux density always has a specified value (for example, 0.15 T) in the range of about 0.1 T to about 0.2 T.

Figure 12:
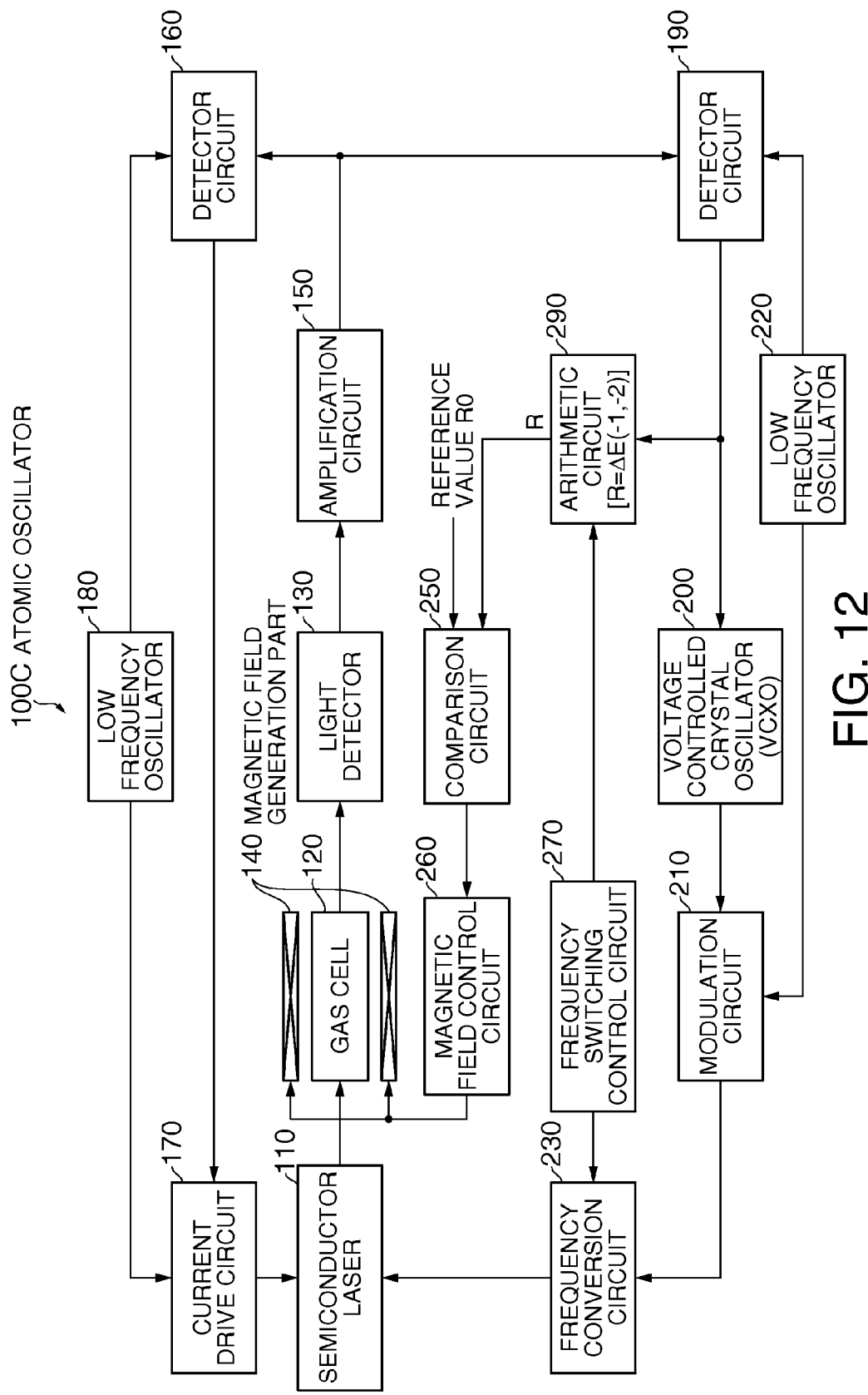
FIG. 12 is a view showing a structure of an atomic oscillator of a second embodiment.

FIG. 12 is a view showing a structure of an atomic oscillator of the second embodiment. In FIG. 12, the same structure as that of FIG. 2 is denoted by the same reference numeral, and its description is omitted or simplified.

As shown in FIG. 12, in an atomic oscillator 100C of the second embodiment, the arithmetic circuit 240 of the atomic oscillator 100A of the first embodiment shown in FIG. 2 is replaced by an arithmetic circuit 290.

Also in this embodiment, similarly to the first embodiment, a frequency switching control circuit 270 switches a frequency conversion rate of a frequency conversion circuit 230 at a specified timing in three ways to $N_0$, $N_1$ and $N_2$, and a semiconductor laser 110 is made to generate one of resonant light pairs for (m,m')=(0,0), (−1,−1) and (−2,−2). In this embodiment, the resonant light pair for (m,m')=(0,0) is generated at the normal operation time, and the resonant light pair for each of (m,m')=(−1,−1) and (−2,−2) is sequentially generated at the time of adjustment of magnetic field intensity.

In order to obtain information of intensity of the present magnetic field, the arithmetic circuit 290 calculates a difference R between $\Delta E_{12}$(−1,−1) and $\Delta E_{12}$(−2,−2) (R=ΔE(−1,−2)) based on the timing signal from the frequency switching control circuit 270. The arithmetic circuit 290 acquires control voltage $V_c$ in a lock state by the EIT phenomenon based on the resonant light pair for each of the magnetic quantum numbers m=−1 and −2, and calculates R. R=ΔE(−1,−2) can be modified as indicated by following expression (4).

$$\begin{aligned} R &= \Delta E(-1, -2) \\ &= \Delta E_{12}(-1, -1) - \Delta E_{12}(-2, -2) \\ &= h \cdot \{f_{12}(-1, -1) - f_{12}(-2, -2)\} \\ &= h \cdot \{2 \cdot N_1 \cdot f_{v1} - 2 \cdot N_2 \cdot f_{v2}\} \\ &= 2 \cdot h \cdot \{N_1 \cdot f_{v1} - N_2 \cdot f_{v2}\} \\ &= 2 \cdot h \cdot \{N_1 \cdot \alpha \cdot V_{c1} - N_2 \cdot \alpha \cdot V_{c2}\} \\ &= 2 \cdot \alpha \cdot h \cdot \{N_1 \cdot V_{c1} - N_2 \cdot V_{c2}\} \end{aligned} \qquad (4)$$

In the expression (4), since $N_1$ and $N_2$ are, for example, multiplication ratios of PLL, they are fixed values. Accordingly, when the oscillation control voltages $V_{c1}$ and $V_{c2}$ of the voltage controlled crystal oscillator (VCXO) 200 are known, R can be calculated.

Then, the arithmetic circuit 290 first acquires the oscillation control voltage $V_{c1}$ (an example of the first profile information) at a specified timing synchronous with a timing when the frequency switching control circuit 270 switches the frequency conversion rate of the frequency conversion circuit 230 from $N_0$ to $N_1$. Next, the arithmetic circuit 240 acquires the oscillation control voltage $V_{c2}$ (an example of the second profile information) at a specified timing synchronous with a timing when the frequency switching control circuit 270 switches the frequency conversion rate of the frequency conversion circuit 230 from $N_1$ to $N_2$. Here, the specified timing may be any timing after the stable state (lock state) occurs in the setting in which the frequency conversion rate of the frequency conversion circuit 230 is $N_1$ or $N_2$. In this way, the arithmetic circuit 290 acquires $V_{c1}$ and $V_{c2}$ in the expression (4), and calculates R based on the expression (4).

A comparison circuit 250 compares R calculated by the arithmetic circuit 290 with a reference value R0, and supplies a comparison result (difference) to a magnetic field control circuit 260. Here, the reference value R0 is, for example, $\Delta E(-1,-2)$ in a state where a magnetic field applied by disturbance is 0, and is a value previously obtained by calculation.

The magnetic field control circuit 260 controls the intensity of magnetic field generated by a magnetic field generation part 140 based on the comparison result of the comparison circuit 250 so that the calculation result of the arithmetic circuit 290 coincides with R0. Here, when R of the calculation result of the arithmetic circuit 240 is larger than R0, the magnetic field control circuit 260 decreases the intensity of the magnetic field generated by the magnetic field generation part 140 by R-R0. On the other hand, when R of the calculation result of the arithmetic circuit 240 is smaller than R0, the magnetic field control circuit 260 increases the intensity of the magnetic field generated by the magnetic field generation part 140 by R0-R. In this way, control can be performed so that the intensity of the magnetic field applied to the gas cell 120 always becomes constant.

Incidentally, the structure including the arithmetic circuit 290, the comparison circuit 250 and the magnetic field control circuit 260 corresponds to the magnetic field control part 60 of FIG. 1. The other correspondence relation is the same as that of the atomic oscillator 100A shown in FIG. 2.

As described above, in the atomic oscillator of the second embodiment, attention is paid to the fact that the degree of change of energy difference between the two ground levels for two different magnetic quantum numbers $m_1$ and $m_2$, that is, $\Delta E_{12}(m1,m1)$, $\Delta E_{12}(m2,m2)$ is different from each other with respect to the change of the magnetic field intensity as shown in, for example, FIG. 5, and attention is paid to the fact that the intensity of the magnetic field in the specified range (for example, in the cesium atom, the range of about 0.1 T to about 0.2 T) and the value of $R=\Delta E_{12}(m1,m1)-\Delta E_{12}(m2,m2)$ are in one-to-one correspondence with each other, and the adjustment of the magnetic field intensity is performed. Specifically, the semiconductor laser 110 sequentially generates the resonant light pair to cause the transition between the two ground levels corresponding to each of $(m,m')=(0,0)$, $(-1,-1)$ and $(-2,-2)$. The oscillation control voltages $V_{c1}$ and $V_{c2}$ capable of specifying $\Delta E_{12}(-1,-1)$ and $\Delta E_{12}(-2,-2)$ are sequentially acquired based on the detection signal of the light detector 130, and $R=\Delta E_{12}(-1,-1)-\Delta E_{12}(-2,-2)$ is calculated. The calculation result R is compared with reference value $R_0$ to specify the change amount of the magnetic field intensity, and control is performed so that the intensity of the magnetic field becomes constant. According to the atomic oscillator of the second embodiment of the structure as described above, since the change amount of the intensity of the magnetic field applied to the alkali metal atom is certainly grasped, and the change of magnetic field intensity can be suppressed within a very small range. Thus, the frequency accuracy can be improved as compared with the related art.

Besides, according to the atomic oscillator of the second embodiment, it is not necessary to apply a weak magnetic field to an alkali metal atom unlike the related art, and the change amount of magnetic field by disturbance can be relatively reduced as compared with the related art. Thus, the stable control of magnetic field is easy, and the frequency stability can be raised.

MODIFIED EXAMPLE

For example, a modification can be made such that the frequency switching control circuit 270 switches the frequency conversion rate of the frequency conversion circuit 230 in two ways to generate the resonant light pair for each of $(m,m')=(0,0)$ and $(-1,-1)$, and the arithmetic circuit 290 calculate $R=\Delta E(0,-1)$ shown in FIG. 11.

Besides, for example, a modification can be made such that the frequency switching control circuit 270 switches the frequency conversion rate of the frequency conversion circuit 230 in two ways to generate the resonant light pair for each of $(m,m')=(+1,+1)$ and $(0,0)$, and the arithmetic circuit 290 calculates $R=\Delta E(+1,0)$ shown in FIG. 11.

Besides, similarly to the structure of the modified example of the atomic oscillator of the first embodiment shown in FIG. 10, also in the second embodiment, the semiconductor laser 110 is not modulated, but generates light of a single frequency $f_0$, an electro-optic modulator (EOM) or an acousto-optic modulator (AOM) modulates the outgoing light of the semiconductor laser 110 by the output signal (modulation signal) of the frequency conversion circuit 230, and the light having the same frequency spectrum as shown in FIG. 3 may be generated.

Also by the structures of the modified examples, the atomic oscillator having the same functions and effects as those of the atomic oscillator 100C can be realized.

(3) Third Embodiment

In the atomic oscillator 100A of the first embodiment, the frequency conversion rate of the frequency conversion circuit 230 is switched at the constant timing irrespective of the state of the present magnetic field, and the adjustment of the magnetic field intensity is performed at the constant period. On the other hand, in the third embodiment, the timing when the frequency conversion rate of the frequency conversion circuit 230 is switched is changed according to the state of the magnetic field. Specifically, the adjustment period of the magnetic field intensity is changed according to the change of the magnetic field intensity.

Figure 13:
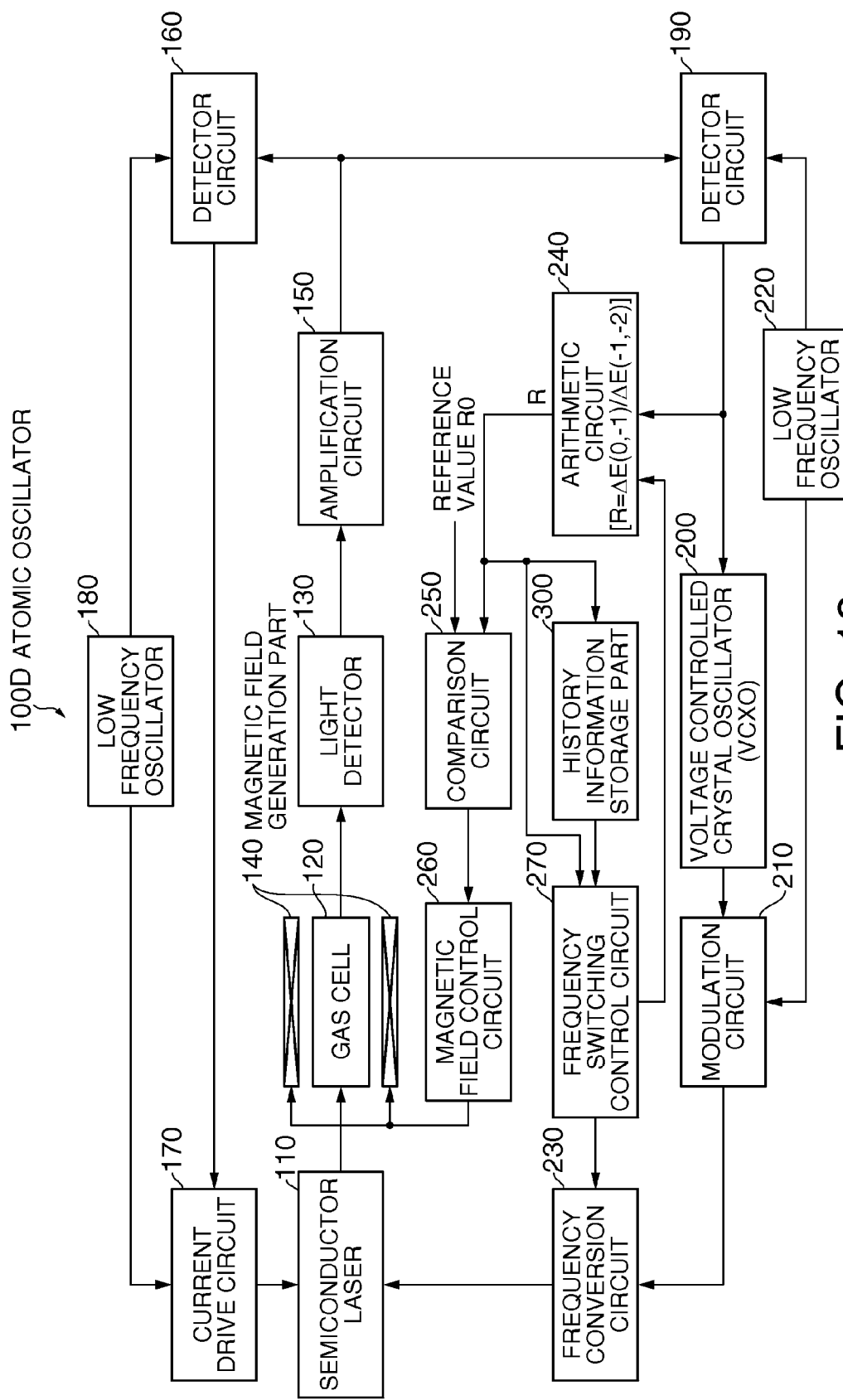
FIG. 13 is a view showing a structure of an atomic oscillator of a third embodiment.
Figure 14:
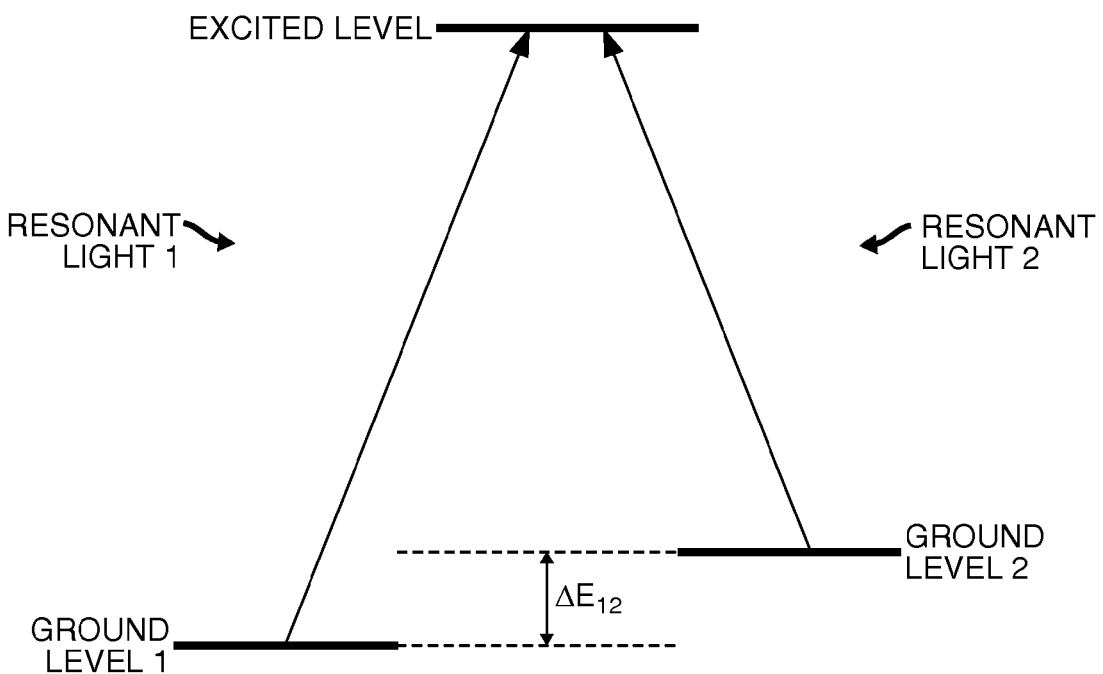
FIG. 14 is a view schematically showing an energy level of an alkali metal atom.

FIG. 13 is a view showing a structure of an atomic oscillator of the third embodiment. In FIG. 13, the same structure as that of FIG. 2 is denoted by the same reference numeral, and its description is omitted or simplified.

As shown in FIG. 13, in an atomic oscillator 100D of the third embodiment, a history information storage part 300 is added to the atomic oscillator 100A of the first embodiment shown in FIG. 2.

Each time an arithmetic circuit 240 newly calculates R, the history information storage part 300 stores a value (an example of magnetic field intensity information) of R of the calculation result as history information. The history information storage part 300 can be realized as RAM (Random Access Memory) or FIFO (First In First Out) by using various memory devices.

For example, when an absolute value of a difference between a value of R stored in the history information storage part 300 at the last time and a value of R calculated by the arithmetic circuit 240 at this time (the value of R stored in the history information storage part 300 at this time) is larger than a specified value, a frequency conversion control circuit 270 determines that the adjustment period of the magnetic field intensity is too long, and sets the switching period (calculation period of R by the arithmetic circuit 240) of the frequency conversion rate of a frequency conversion circuit 230 to be short. Further, for example, when the calculated period is shorter than a specified threshold, or when an absolute value of a difference between a value of R stored in the history information storage part 300 at the last time and a value of R calculated by the arithmetic circuit 240 at this time (the value of R stored in the history information storage part 300 at this time) is smaller than a specified value, the frequency switching control circuit determines that the adjustment period of the magnetic field intensity is too short, and sets the switching period (calculation period of R by the arithmetic circuit 240) of the frequency conversion rate of the frequency conversion circuit 230 to be long.

As described above, according to the third embodiment, as the change of the magnetic field intensity becomes large, the adjustment period of the magnetic field intensity can be shortened. Thus, the deterioration of frequency stability accuracy due to the change of the magnetic field intensity can be reduced. Besides, when the change of the magnetic field intensity is mild, the adjustment period of the magnetic field intensity can be made a specified length. Thus, power consumption can be optimized while the frequency stability accuracy is kept.

Incidentally, the history information storage part 300 corresponds to the storage part 70 of FIG. 1. The other correspondence relation is the same as the atomic oscillator 100A shown in FIG. 2.

According to the atomic oscillator of the third embodiment, in addition to the same effects as those of the atomic oscillator of the first embodiment, more delicate magnetic field control can be performed such that when the magnetic field is frequently changed or the change amount of the magnetic field is large, the period of the switching timing is shortened to shorten the adjustment period of the magnetic field, and when the magnetic field is hardly changed, the period of the switching timing is lengthened to lengthen the adjustment period of the magnetic field, and the frequency stability can be improved.

MODIFIED EXAMPLE

For example, the history information storage part 300 may store, as the history information, the respective values (example of the profile information) of oscillation control voltages $V_{c0}$, $V_{c1}$ and $V_{c2}$ of a voltage controlled crystal oscillator (VCXO) 200 acquired by the arithmetic circuit 240 instead of the value of R calculated by the arithmetic circuit 240. In this case, the frequency switching control circuit 270 determines whether the adjustment period of the magnetic field intensity is too long or too short based on whether at least one of the absolute values of differences between the respective values of the oscillation control voltages $V_{c0}$, $V_{c1}$ and $V_{c2}$ stored in the history information storage part 300 at the last time and the respective values (values of $V_{c0}$, $V_{c1}$ and $V_{c2}$ stored in the history information storage part 300 at this time) of $V_{c0}$, $V_{c1}$ and $V_{c2}$ acquired by the arithmetic circuit 240 at this time is larger or shorter than a specified threshold, and may adjust the switching period (calculation period of R by the arithmetic circuit 240) of the frequency conversion rate of the frequency conversion circuit 230.

Besides, for example, the history information storage part 300 store history information obtained at plural times in addition to the last history information, and the frequency switching control circuit 270 may adjust the switching period (calculation period of R by the arithmetic circuit 240) of the frequency conversion rate of the frequency conversion circuit 230 based on three or more pieces of history information (for example, last time but one, last time, this time).

Besides, for example, similarly to the modified example of the atomic oscillator of the first embodiment, a modification can be made such that the arithmetic circuit 240 calculates $R=\Delta E(+1,0)/\Delta E(0,-1)$, $R=\Delta E(+1,0)/\Delta E(-1,-2)$ or $R^{-1}=\Delta E(0,-1)/\Delta E(+1,0)$, $R^{-1}=\Delta E(-1,-2)/\Delta E(+1,0)$.

Besides, similarly to the structure of the modified example of the atomic oscillator of the first embodiment shown in FIG. 10, also in the third embodiment, the semiconductor laser 110 is not modulated, but generates light of a single frequency $f_0$, an electro-optic modulator (EOM) or an acousto-optic modulator (AOM) modulates the outgoing light of the semiconductor laser 110 by the output signal (modulation signal) of the frequency conversion circuit 230, and the light having the same frequency spectrum as shown FIG. 3 may be generated.

Also by the structures of the modified examples, the atomic oscillator having the same functions and effects as those of the atomic oscillator 100D can be realized.

Incidentally, the invention is not limited to the embodiments, and can be variously modified within the range of the gist of the invention.

For example, in the first embodiment to the third embodiment, although the control is performed so that the two kinds of lights (frequency $f_0 \pm f_m$) in the primary side bands of the outgoing light of the semiconductor laser 110 become the resonant light pair, no limitation is made to this. For example, control may be performed such that the light of the center frequency $f_0$ and the light of the frequency $f_0 + f_m$ become a resonant light pair, and the light of the center frequency $f_0$ and the light of the frequency $f_0 - f_m$ become a resonant light pair.

Besides, for example, in the first embodiment to the third embodiment, the resonant light pair is generated by modulating one semiconductor laser, more simply, two semiconductor lasers are driven by separate drive currents and the resonant light pair may be generated.

The invention includes substantially the same structure (for example, the same structure in function, method and result, or the same structure in object and effect) as the structure described in the embodiments. Besides, the invention includes the structure in which an unessential portion of the structure described in the embodiments is replaced. Besides, the invention includes the structure having the same operation and effect as the structure described in the embodiments, or the structure in which the same object is achieved. Besides, the invention includes the structure in which a well-known technique is added to the structure described in the embodiments.

The entire disclosure of Japanese Patent Application No. 2010-045081, filed Mar. 2, 2010 is expressly incorporated by reference herein.

What is claimed is:

1. An atomic oscillator using an electromagnetically induced transparency phenomenon produced by irradiating a resonant light pair to an alkali metal atom, comprising:
   a gaseous alkali metal atom;
   a light source that generates a plurality of lights having coherency and including a first light and a second light different in frequency and irradiates the lights to the alkali metal atom;
   a magnetic field generation part that generates a magnetic field to cause Zeeman splitting in each of a first ground level and a second ground level of the alkali metal atom;
   a light detection part that receives a light passing through the alkali metal atom and generates a detection signal corresponding to an intensity of the received light;
   a frequency control part that performs frequency control of at least one of the first light and the second light based on the detection signal and causes the first light and the second light to become the resonant light pair which produces the electromagnetically induced transparency phenomenon in the alkali metal atom; and
   a magnetic field control part that controls, based on the detection signal, an intensity of the magnetic field generated by the magnetic field generation part, wherein
   the frequency control part switches a frequency of at least one of the first light and the second light at a specified switching timing, and causes the first light and the second light to sequentially become the resonant light pair which causes a transition between the first ground level and the second ground level corresponding to each of a plurality of magnetic quantum numbers among a plurality of the first ground levels and a plurality of the second ground levels generated by the Zeeman splitting, and
   the magnetic field control part sequentially acquires profile information capable of specifying an energy difference between the first ground level and the second ground level when the first light and the second light become the resonant light pair to cause the transition between the first ground level and the second ground level corresponding to each of the magnetic quantum numbers, and controls the intensity of the magnetic field generated by the magnetic field generation part based on a plurality of pieces of the acquired profile information to cause the intensity of the magnetic field applied to the alkali metal atom to become constant.

2. The atomic oscillator according to claim 1, wherein
   the light source is subjected to frequency modulation by a modulation signal of a specified frequency, and generates the plurality of lights including the first light and the second light, and
   the frequency control part includes:
   a voltage control oscillator to generate an oscillation signal oscillating at a frequency corresponding to an oscillation control voltage based on the detection signal;
   a frequency conversion part that performs frequency conversion of the oscillation signal at a frequency conversion rate and generates the modulation signal; and
   a frequency switching control part that switches the frequency conversion rate at the switching timing and causes the first light and the second light to sequentially become the resonant light pair to cause the transition between the first ground level and the second ground level corresponding to each of the magnetic quantum numbers.

3. The atomic oscillator according to claim 2, wherein the magnetic field control part sequentially acquires, as the profile information, a value of the oscillation control voltage when the first light and the second light become the resonant light pair to cause the transition between the first ground level and the second ground level corresponding to each of the magnetic quantum numbers.

4. The atomic oscillator according to claim 1, wherein
   the frequency control part changes the frequency of at least one of the first light and the second light and causes the first light and the second light to become the resonant light pair to cause the transition between the first ground level and the second ground level corresponding to each of a first magnetic quantum number, a second magnetic quantum number and a third magnetic quantum number, and
   when the first light and the second light become the resonant light pair to cause the transition between the first ground level and the second ground level corresponding to each of the first magnetic quantum number, the second magnetic quantum number and the third magnetic quantum number, the magnetic field control part acquires first profile information, second profile information and third profile information, and based on the first profile information, the second profile information and the third profile information, the magnetic field control part calculates a ratio of a difference between an energy difference between the first ground level and the second ground level corresponding to the first magnetic quantum number and an energy difference between the first ground level and the second ground level corresponding to the second magnetic quantum number to a difference between an energy difference between the first ground level and the second ground level corresponding to the second magnetic quantum number and an energy difference between the first ground level and the second ground level corresponding to the third magnetic quantum number, and controls the intensity of the magnetic field generated by the magnetic field generation part based on a calculation result.

5. The atomic oscillator according to claim 1, wherein
   the frequency control part changes the frequency of at least one of the first light and the second light and causes the first light and the second light to become the resonant light pair to cause the transition between the first ground level and the second ground level corresponding to each of a first magnetic quantum number and a second magnetic quantum number, and
   the magnetic field control part acquires first profile information and second profile information when the first light and the second light become the resonant light pair to cause the transition between the first ground level and the second ground level corresponding to each of the first magnetic quantum number and the second magnetic quantum number, and based on based on the first profile information and the second profile information, the magnetic field control part calculates a difference between an energy difference between the first ground level and the second ground level corresponding to the first magnetic quantum number and an energy difference between the first ground level and the second ground level corresponding to the second magnetic quantum number, and controls the intensity of the magnetic field generated by the magnetic field generation part based on a calculation result.

6. The atomic oscillator according to claim 1, wherein
   the frequency control part changes a period of the switching timing according to a degree of intensity change of the magnetic field generated by the magnetic field generation part.

7. The atomic oscillator according to claim 6, further comprising a storage part to store the profile information or magnetic field intensity information capable of specifying the intensity of the magnetic field based on the profile information, wherein
the frequency control part determines the degree of the intensity change of the magnetic field generated by the magnetic field generation part based on the profile information or the magnetic field intensity information stored in the storage part, and changes the period of the switching timing.

* * * * *